(12) United States Patent
Sengoku et al.

(10) Patent No.: US 9,071,220 B2
(45) Date of Patent: Jun. 30, 2015

(54) EFFICIENT N-FACTORIAL DIFFERENTIAL SIGNALING TERMINATION NETWORK

(71) Applicant: QUALCOMM Incorporated, San Diego, CA (US)

(72) Inventors: Shoichiro Sengoku, San Diego, CA (US); George Alan Wiley, San Diego, CA (US); Chulkyu Lee, San Diego, CA (US); Joseph Cheung, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 112 days.

(21) Appl. No.: 13/832,990

(22) Filed: Mar. 15, 2013

(65) Prior Publication Data
US 2014/0254711 A1  Sep. 11, 2014

Related U.S. Application Data

(60) Provisional application No. 61/774,408, filed on Mar. 7, 2013, provisional application No. 61/778,768, filed on Mar. 13, 2013.

(51) Int. Cl.
| | |
|---|---|
| H03K 17/16 | (2006.01) |
| H03H 2/00 | (2006.01) |
| H04B 1/04 | (2006.01) |
| H04L 25/02 | (2006.01) |
| H04L 25/14 | (2006.01) |

(52) U.S. Cl.
CPC .............. H03H 2/005 (2013.01); H04B 1/04 (2013.01); H04L 25/0272 (2013.01); H04L 25/0278 (2013.01); H04L 25/14 (2013.01)

(58) Field of Classification Search
None
See application file for complete search history.

(56) References Cited

U.S. PATENT DOCUMENTS

| | | | |
|---|---|---|---|
| 6,320,406 B1* | 11/2001 | Morgan et al. ................ 326/14 |
| 6,556,628 B1* | 4/2003 | Poulton et al. ............... 375/257 |
| 7,339,502 B2* | 3/2008 | Furtner ........................ 341/55 |
| 7,358,869 B1 | 4/2008 | Chiarulli et al. |
| 7,741,876 B2* | 6/2010 | Fusayasu et al. .............. 326/86 |
| 7,781,677 B2* | 8/2010 | Matsubara et al. ....... 174/113 R |

(Continued)

FOREIGN PATENT DOCUMENTS

WO    WO-2008151251 A1    12/2008

OTHER PUBLICATIONS

International Search Report and Written Opinion—PCT/US2014/022031—ISA/EPO—Jul. 25, 2014.

*Primary Examiner* — Crystal L Hammond
(74) *Attorney, Agent, or Firm* — Loza & Loza LLP

(57) ABSTRACT

A termination network circuit for a differential signal transmitter comprises a plurality of n resistance elements and a plurality of differential signal drivers. A first end of each of the resistance elements is coupled at a common node, where n is an integer value and is the number of conductors used to transmit a plurality of differential signals. Each differential signal driver may include a positive terminal driver and a negative terminal driver. The positive terminal driver is coupled to a second end of a first resistance element while the negative terminal driver is coupled to a second end of a second resistance element. The positive terminal driver and the negative terminal driver are separately and independently switchable to provide a current having a magnitude and direction. During a transmission cycle each of the resistance elements has a current of a different magnitude and/or direction than the other resistance elements.

36 Claims, 33 Drawing Sheets

(56) References Cited

U.S. PATENT DOCUMENTS

| | | | |
|---|---|---|---|
| 7,983,347 B2 * | 7/2011 | Hamada et al. | 375/244 |
| 8,264,253 B2 * | 9/2012 | Tian et al. | 326/83 |
| 8,284,848 B2 * | 10/2012 | Nam et al. | 375/257 |
| 8,848,810 B2 * | 9/2014 | Lee et al. | 375/260 |
| 2005/0053171 A1 | 3/2005 | Pickering et al. | |
| 2005/0104649 A1 * | 5/2005 | Yonezawa | 327/379 |
| 2006/0006902 A1 * | 1/2006 | Sagiv | 326/30 |
| 2007/0188187 A1 * | 8/2007 | Oliva et al. | 326/30 |
| 2007/0241836 A1 * | 10/2007 | Miller | 333/1 |
| 2010/0001758 A1 * | 1/2010 | Dreps et al. | 326/30 |

\* cited by examiner

Traditional Differential Signaling System

FIG. 3  *N Factorial Differential Signaling*

1102

| Tally of current from connected drivers | | | Possible total current at R | |
|---|---|---|---|---|
| +1 | +1 | +1 | +3 | Alldriven +1 |
| +1 | +1 | -1 | +1 | One driven -1 |
| +1 | -1 | -1 | -1 | One driven +1 |
| -1 | -1 | -1 | -3 | All driven -1 |

*FIG. 11*

| Raw Symbols | Voltage at each R_TERM | | | | Differential voltage | | | | | | 0 diff level? | V[3:0] |
|---|---|---|---|---|---|---|---|---|---|---|---|---|
| {CD,DB,AD,AC,CB,AB} | DO | CO | BO | AO | DB | CB | AD | AC | CD | AB | | |
| 000000 | 1 | -1 | 3 | 3 | -2 | -4 | -4 | -2 | -2 | -6 | | |
| 000001 | 1 | -1 | 1 | -1 | 0 | -2 | -2 | 0 | -2 | -2 | Zero | |
| 000010 | -1 | 1 | 3 | 3 | -4 | -2 | -2 | -4 | 2 | -6 | | |
| 000011 | -1 | 1 | 1 | -1 | -2 | 0 | 0 | -2 | 2 | -2 | Zero | |
| 000100 | 1 | -3 | 3 | -1 | -2 | -6 | -2 | 2 | -4 | -4 | | 0x8 |
| 000101 | 1 | -3 | 1 | 1 | 0 | -4 | 0 | 4 | -4 | 0 | Zero | |
| 000110 | -1 | -1 | 3 | -1 | -4 | -4 | 0 | 0 | 0 | -4 | Zero | |
| 000111 | -1 | -1 | 1 | 1 | -2 | -2 | 2 | 2 | 0 | 0 | Zero | |
| 001000 | -1 | -1 | 3 | -1 | -4 | -4 | 0 | 0 | 0 | -4 | Zero | |
| 001001 | -1 | -1 | 1 | 1 | -2 | -2 | 2 | 2 | 0 | 0 | Zero | |
| 001010 | -3 | 1 | 3 | -1 | 6 | 2 | 2 | 2 | 4 | -4 | | 0xC |
| 001011 | -3 | 1 | 1 | 1 | -4 | 0 | 4 | 0 | 4 | 0 | Zero | |
| 001100 | -1 | -3 | 3 | 1 | -4 | -6 | 2 | 4 | -2 | -2 | | 0xA |
| 001101 | -1 | -3 | 1 | 3 | -2 | -4 | 4 | 6 | -2 | 2 | | 0x1 |
| 001110 | -3 | -1 | 3 | 1 | -6 | -4 | 4 | 2 | 2 | -2 | | 0xE |
| 001111 | -3 | -1 | 1 | 3 | -4 | -2 | 6 | 4 | 2 | 2 | | 0x5 |
| 010000 | 1 | 1 | 1 | -3 | 0 | 0 | -4 | -4 | 0 | -4 | Zero | |
| 010001 | 1 | 1 | -1 | -1 | 2 | 2 | -2 | -2 | 0 | 0 | Zero | |
| 010010 | -1 | 3 | 1 | -3 | 2 | 2 | 2 | -6 | 4 | -4 | | 0x0 |
| 010011 | -1 | 3 | -1 | -1 | 0 | 4 | 0 | -4 | 4 | 0 | Zero | |
| 010100 | 1 | -1 | 1 | -1 | 0 | -2 | -2 | 0 | -2 | -2 | Zero | |
| 010101 | 1 | -1 | -1 | 1 | 2 | 0 | 0 | 2 | -2 | 2 | Zero | |
| 010110 | -1 | 1 | 1 | -1 | -2 | 0 | 0 | -2 | 2 | -2 | Zero | |
| 010111 | -1 | 1 | -1 | 1 | 0 | 2 | 2 | 0 | 2 | 2 | Zero | |
| 011000 | -1 | 1 | 1 | -1 | -2 | 0 | 0 | -2 | 2 | -2 | Zero | |
| 011001 | -1 | 1 | -1 | 1 | 0 | 2 | 2 | 0 | 2 | 2 | Zero | |
| 011010 | -3 | 3 | 1 | -1 | -4 | 2 | 2 | -4 | 6 | -2 | | |
| 011011 | -3 | 3 | -1 | 1 | -2 | 4 | 4 | -2 | 6 | 2 | | |
| 011100 | -1 | -1 | 1 | 1 | -2 | -2 | 2 | 2 | 0 | 0 | Zero | |
| 011101 | -1 | -1 | -1 | 3 | 0 | 0 | 4 | 4 | 0 | 4 | Zero | |
| 011110 | -3 | 1 | 1 | 1 | -4 | 0 | 4 | 0 | 4 | 0 | Zero | |
| 011111 | -3 | 1 | -1 | 3 | -2 | 2 | 6 | 2 | 4 | 4 | | 0x7 |

*FIG. 12A*

| Raw Symbols {CD,DB,AD,AC,CB,AB} | Voltage at each R_TERM | | | | Differential voltage | | | | | | 0 diff level? | V[3:0] |
|---|---|---|---|---|---|---|---|---|---|---|---|---|
| | DO | CO | BO | AO | DB | CB | AD | AC | CD | AB | | |
| 100000 | 3 | -1 | 1 | -3 | 2 | -2 | -6 | 2 | -4 | -4 | | 0x4 |
| 100001 | 3 | -1 | -1 | -1 | 4 | 0 | -4 | 0 | -4 | 0 | Zero | |
| 100010 | 1 | 1 | 1 | -3 | 0 | 0 | -4 | -4 | 0 | -4 | Zero | |
| 100011 | 1 | 1 | -1 | -1 | 2 | 2 | -2 | -2 | 0 | 0 | Zero | |
| 100100 | 3 | -3 | 1 | -1 | 2 | -4 | -4 | 2 | -6 | -2 | | |
| 100101 | 3 | -3 | -1 | 1 | 4 | -2 | -2 | 4 | -6 | 2 | | |
| 100110 | 1 | -1 | 1 | -1 | 0 | -2 | -2 | 0 | -2 | -2 | Zero | |
| 100111 | 1 | -1 | -1 | 1 | 2 | 0 | 0 | 2 | -2 | 2 | Zero | |
| 101000 | 1 | -1 | 1 | -1 | 0 | -2 | -2 | 0 | -2 | -2 | Zero | |
| 101001 | 1 | -1 | -1 | 1 | 2 | 0 | 0 | 2 | -2 | 2 | Zero | |
| 101010 | -1 | 1 | 1 | -1 | -2 | 0 | 0 | -2 | 2 | -2 | Zero | |
| 101011 | -1 | 1 | -1 | 1 | 0 | 2 | 2 | 0 | 2 | 2 | Zero | |
| 101100 | 1 | -3 | 1 | 1 | 0 | -4 | 0 | 4 | -4 | 0 | Zero | |
| 101101 | 1 | -3 | -1 | 3 | 2 | -2 | 2 | 6 | -4 | 4 | | 0x3 |
| 101110 | -1 | -1 | 1 | 1 | -2 | -2 | 2 | 2 | 0 | 0 | Zero | |
| 101111 | -1 | -1 | -1 | 3 | 0 | 0 | 4 | 4 | 0 | 4 | Zero | |
| 110000 | 3 | 1 | -1 | -3 | 4 | 2 | -6 | -4 | -2 | -2 | | 0x6 |
| 110001 | 3 | 1 | -3 | -1 | 6 | 4 | -4 | -2 | -2 | 2 | | 0xD |
| 110010 | 1 | 3 | -1 | -3 | 2 | 4 | -4 | -6 | 2 | -2 | | 0x2 |
| 110011 | 1 | 3 | -3 | -1 | 4 | 6 | -2 | -4 | 2 | 2 | | 0x9 |
| 110100 | 3 | -1 | -1 | -1 | 4 | 0 | -4 | 0 | -4 | 0 | Zero | |
| 110101 | 3 | -1 | -3 | 1 | 6 | 2 | -2 | 2 | -4 | 4 | | 0xF |
| 110110 | 1 | 1 | -1 | -1 | 2 | 2 | -2 | -2 | 0 | 0 | Zero | |
| 110111 | 1 | 1 | -3 | 1 | 4 | 4 | 0 | 0 | 0 | 4 | Zero | |
| 111000 | 1 | 1 | -1 | -1 | 2 | 2 | -2 | -2 | 0 | 0 | Zero | |
| 111001 | 1 | 1 | -3 | 1 | 4 | 4 | 0 | 0 | 0 | 4 | Zero | |
| 111010 | -1 | 3 | -1 | -1 | 0 | 4 | 0 | -4 | 4 | 0 | Zero | |
| 111011 | -1 | 3 | -3 | 1 | 2 | 6 | 2 | -2 | 4 | 4 | | 0xB |
| 111100 | 1 | -1 | -1 | 1 | 2 | 0 | 0 | 2 | -2 | 2 | Zero | |
| 111101 | 1 | -1 | -3 | 3 | 4 | 2 | 2 | 4 | -2 | 6 | | |
| 111110 | -1 | 1 | -1 | 1 | 0 | 2 | 2 | 0 | 2 | 2 | Zero | |
| 111111 | -1 | 1 | -3 | 3 | 2 | 4 | 4 | 2 | 2 | 6 | | |

*FIG. 12B*

| Raw Symbols | Voltage at each $R_{TERM}$ | | | | Differential voltage | | | | | |
|---|---|---|---|---|---|---|---|---|---|---|
| {CD,DB,AD,AC,CB,AB} | DO | CO | BO | AO | DB | CB | AD | AC | CD | AB |
| 000000 | 1 | -1 | 3 | -3 | -2 | -4 | -4 | -2 | -2 | -6 |
| 000010 | -1 | 1 | 3 | -3 | -4 | -2 | -2 | -4 | 2 | -6 |
| 000100 | 1 | -3 | 3 | -1 | -2 | -6 | -2 | 2 | -4 | -4 |
| 001010 | -3 | 1 | 3 | -1 | -6 | -2 | 2 | -2 | 4 | -4 |
| 001100 | -1 | -3 | 3 | 1 | -4 | -6 | 2 | 4 | -2 | -2 |
| 001101 | -1 | -3 | 1 | 3 | -2 | -4 | 4 | 6 | -2 | 2 |
| 001110 | -3 | -1 | 3 | 1 | -6 | -4 | 4 | 2 | 2 | -2 |
| 001111 | -3 | -1 | 1 | 3 | -4 | -2 | 6 | 4 | 2 | 2 |
| 010010 | -1 | 3 | 1 | -3 | -2 | 2 | -2 | -6 | 4 | -4 |
| 011010 | -3 | 3 | 1 | -1 | -4 | 2 | 2 | -4 | 6 | -2 |
| 011011 | -3 | 3 | -1 | 1 | -2 | 4 | 4 | -2 | 6 | 2 |
| 011111 | -3 | 1 | -1 | 3 | -2 | 2 | 6 | 2 | 4 | 4 |
| 100000 | 3 | -1 | 1 | -3 | 2 | -2 | -6 | -2 | -4 | -4 |
| 100100 | 3 | -3 | 1 | -1 | 2 | -4 | -4 | 2 | -6 | -2 |
| 100101 | 3 | -3 | -1 | 1 | 4 | -2 | -2 | 4 | -6 | 2 |
| 101101 | 1 | -3 | -1 | 3 | 2 | -2 | 2 | 6 | -4 | 4 |
| 110000 | 3 | 1 | -1 | -3 | 4 | 2 | -6 | -4 | -2 | -2 |
| 110001 | 3 | 1 | -3 | -1 | 6 | 4 | -4 | -2 | -2 | 2 |
| 110010 | 1 | 3 | -1 | -3 | 2 | 4 | -4 | -6 | 2 | -2 |
| 110011 | 1 | 3 | -3 | -1 | 4 | 6 | -2 | -4 | 2 | 2 |
| 110101 | 3 | -1 | -3 | 1 | 6 | 2 | -2 | 2 | -4 | 4 |
| 111011 | -1 | 3 | -3 | 1 | 2 | 6 | 2 | -2 | 4 | 4 |
| 111101 | 1 | -1 | -3 | 3 | 4 | 2 | 2 | 4 | -2 | 6 |
| 111111 | -1 | 1 | -3 | 3 | 2 | 4 | 4 | 2 | 2 | 6 |

|  | # of wires / pins | # of states per cycle | Bits per cycle | # of drivers / receivers | # of differential voltage level |
|---|---|---|---|---|---|
|  | $n$ | $s\ (=2^{n/2})$ | $\log_2(s)$ | $d\ (=n/2)$ | 1 |
| Traditional differential signaling | 4 | 4 | 2 | 2 | 1 |
| | 6 | 8 | 3 | 3 | |
| | 8 | 16 | 4 | 4 | |
| | 10 | 32 | 5 | 5 | |
| | 12 | 64 | 6 | 6 | |

1404

|  | # of wires / pins | # of states per cycle | Bits per cycle | # of drivers / receivers | # of differential voltage level |
|---|---|---|---|---|---|
|  | $n$ | $s\ (=n!)$ | $\log_2(s)$ | $d\ (={}_nC_2)$ | $n-1$ |
| N Factorial | 3 | 6 | 2.58 | 3 | 2 |
| | 4 | 24 | 4.58 | 6 | 3 |
| | 5 | 120 | 6.91 | 10 | 4 |
| | 6 | 720 | 9.49 | 15 | 5 |

*FIG. 14*

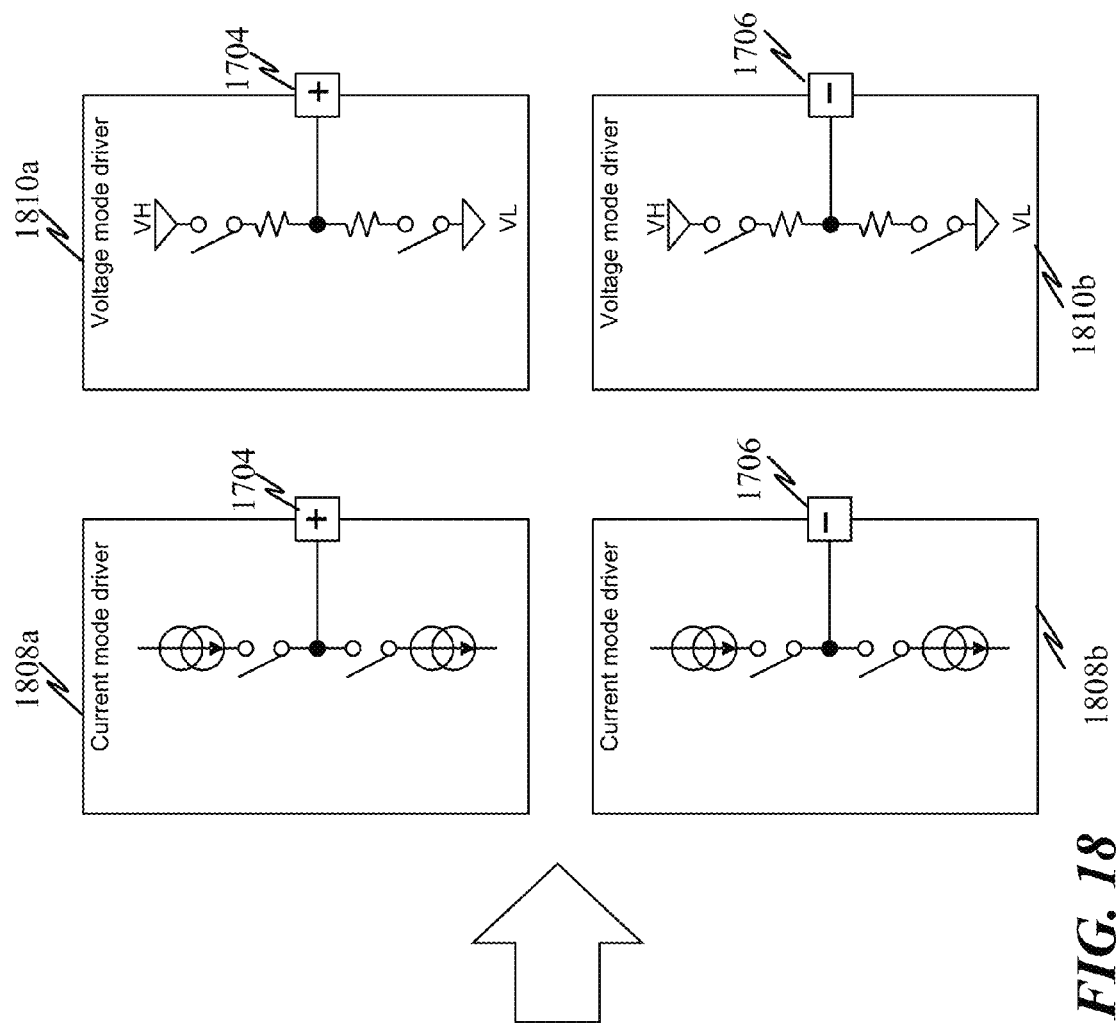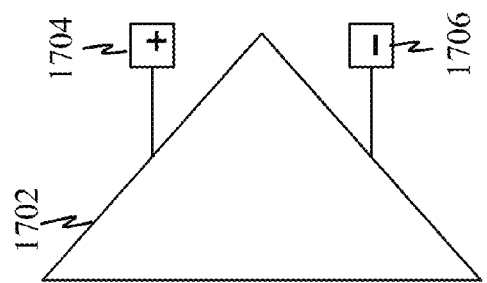
FIG. 18

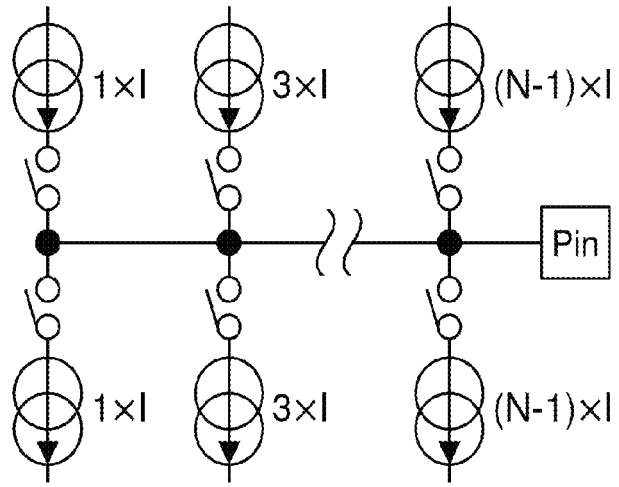
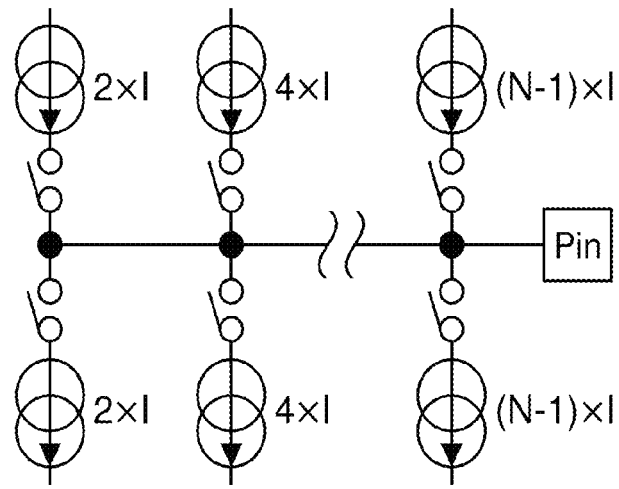
*FIG. 31*

US 9,071,220 B2

EFFICIENT N-FACTORIAL DIFFERENTIAL SIGNALING TERMINATION NETWORK

CLAIM OF PRIORITY UNDER 35 U.S.C. §119

The present application for patent claims priority to U.S. Provisional Application No. 61/774,408 entitled "Transcoding Method For Multi-Wire Signaling That Embeds Clock Information In Transition Of Signal State", filed Mar. 7, 2013, and U.S. Provisional Application No. 61/778,768 entitled "Transcoding Method For Multi-Wire Signaling That Embeds Clock Information In Transition Of Signal State", filed Mar. 13, 2013, both of which are assigned to the assignee hereof and hereby expressly incorporated by reference herein.

FIELD

The present disclosure pertains to power-efficient termination networks for transmitting differential signals over a plurality of conductors.

BACKGROUND

In multi-signal data transfer, differential signaling is sometimes used to transmit information by sending complementary signals on two paired wires/conductors, where the information is conveyed by the difference between the paired wires/conductors.

FIG. 1 illustrates a typical differential signaling system. A transmitter device 102 may include a plurality of drivers 108, each driver 108 coupled to a pair of wires/conductors 106a/106b, 106c/106d, and 106e/106f. A receiver device 104 may include a plurality of receivers 110, each receiver 110 coupled to one of the pair of wires/conductors 106a/106b, 106c/106d, and 106e/106f. A resistance R 120 may be present between each pair of wires/conductors 106a/106b, 106c/106d, and 106e/106f. The transmitter device 102 receives input bits 118, encodes them into differential signals, and transmits them to the receiver device 104 via each pair of wires/conductors 106a/106b, 106c/106d, and 106e/106f. The receiver device 104 receives the differential signals via each pair of wires/conductors 106a/106b, 106c/106d, and 106e/106f, decodes the differential signals, and provides output bits 120. In this typical differential signaling system, n wires and n/2 drivers/receivers are used and are capable of representing up to $2^{(n/2)}$ states (or n/2 bits) per cycle.

FIG. 2 further illustrates the transmission of differential signals across the pair of wires/conductors 106a/106b, 106c/106d, and 106e/106f of FIG. 1. As can be appreciated, a total of eight (8) states 202 may be possible using six (6) wires under this traditional differential signaling system.

However, it would be desirable to improve on the traditional differential signaling approach to provide even more states per line using a differential signaling system while also conserving power where possible.

SUMMARY

A first aspect provides a termination network circuit for a differential signal transmitter. The termination network circuit includes a plurality of n resistance elements and a plurality of differential signal drivers. A first end of each of the resistance elements are coupled at a common node, where n is an integer value (e.g., n=>3) and is also the number of conductors used to transmit a plurality of differential signals. In one example, all resistance elements have the same resistance value.

Each differential signal driver may include a positive terminal driver and a negative terminal driver. The positive terminal driver may be coupled to a second end of a first resistance element while the negative terminal driver may be coupled to a second end of a second resistance element. The positive terminal driver and the negative terminal driver are separately and independently switchable to provide a current having a magnitude and direction. In one example, the only electrical path between the plurality of differential signal drivers is through the plurality of n resistance elements and the common node.

In one implementation, during a transmission cycle of the plurality differential signals each of the n resistance elements has a current of a different magnitude and/or direction than the other resistance elements. The combination of all differential signals over the n resistance elements during a transmission cycle has a non-zero voltage differential.

In one example, the differential signals may be generated from a subset of raw symbols selected from a plurality of possible raw symbols, the subset of raw symbol equaling n! states that generate a non-zero voltage differential at the termination network circuit.

According to one feature, one of the positive terminal driver and negative terminal driver is selectively shut off to eliminate current cancellations across a resistance element.

In some implementations, each of the positive/negative terminal driver includes a plurality of switchable circuits, each switchable circuit independently controlled from other switchable circuits in the same positive/negative terminal driver.

Each switchable circuit includes a first switch that causes current to flow out of a corresponding positive/negative terminal driver, and a second switch that causes current to flow into the corresponding positive/negative terminal driver.

In one example, the plurality of switchable circuits may include a first switchable circuit that provides a first current flow to/from the corresponding terminal and a second switchable circuit that provides a second current flow to/from the corresponding terminal. The second current flow may be of different magnitude but same direction as the first current flow. The second current flow may be an integer multiple of the first current flow. The plurality of switchable circuits may further include a third switchable circuit that provides a third current flow to/from the corresponding terminal, where the second current flow is a fixed increment from the first current flow, and the third current flow is the same fixed increment from the second current flow. In some instances, the magnitude and/or number of switchable circuits may be a function of the number of conductors used.

Another aspect provides a method for conserving power in a termination network for differential signaling. A first end of a plurality of n resistance elements are coupled together at a common node, where n is an integer value (e.g., n=>3) and is also the number of conductors used to transmit a plurality of differential signals. Each of a plurality of differential signal drivers may be split into a positive terminal driver and a negative terminal driver. The positive terminal driver is coupled to a second end of a first resistance element. The negative terminal driver is coupled to a second end of a second resistance element, wherein the positive terminal driver and the negative terminal driver are separately and independently switchable to provide a current having a magnitude and direction. In some examples, all resistance elements may have the same resistance value. During a transmission cycle of the plurality differential signals each of the n resistance elements has a current of a different magnitude and/or direction than the other resistance elements. Additionally, the combination of all differential signals over the n resistance elements during a transmission cycle has a non-zero voltage differential. In one example, the differential signals are generated from a subset of raw symbols selected from a plurality of possible raw symbols, the subset of raw symbol equaling n! states that generate a non-zero voltage differential at the termination network circuit.

According to one feature, one of the positive terminal driver and negative terminal driver is selectively shut off to eliminate current cancellations across a resistance element. In some instances, the only electrical path between the plurality of differential signal drivers is through the plurality of n resistance elements and the common node.

In some implementations, each of the positive/negative terminal driver may include a plurality of switchable circuits, each switchable circuit independently controlled from other switchable circuit in the same positive/negative terminal driver. Each switchable circuit may include a first switch that causes current to flow out of a corresponding positive/negative terminal driver, and a second switch that causes current to flow into the corresponding positive/negative terminal driver. The plurality of switchable circuits may include a first switchable circuit that provides a first current flow to/from the corresponding terminal and a second switchable circuit that provides a second current flow to/from the corresponding terminal. The second current flow may be of different magnitude but same direction as the first current flow. The plurality of switchable circuits may further include a third switchable circuit that provides a third current flow to/from the corresponding terminal, where the second current flow is a fixed increment from the first current flow, and the third current flow is the same fixed increment from the second current flow.

DRAWINGS

Various features, nature and advantages may become apparent from the detailed description set forth below when taken in conjunction with the drawings in which like reference characters identify correspondingly throughout.

FIG. 1 illustrates a typical differential signaling system.

FIG. 2 further illustrates the transmission of differential signals across the pair of wires/conductors of FIG. 1.

FIG. 11 illustrates a table of the possible unitary current flows across each termination resistance R of the tetrahedron termination network of FIG. 9.

FIG. 12 (comprising FIGS. 12A and 12B) is a table showing the various combinations of raw symbols and those symbols having zero differential voltage for a 4-wire tetrahedron termination network.

FIG. 13 is a table showing the valid raw symbols from the table in FIG. 12 having a non-zero differential voltage for the 4-wire tetrahedron termination network.

FIG. 14 are two tables comparing the efficiency with which information may be transmitted using a traditional differential signaling approach and a N-factorial differential signaling approach.

FIG. 18 illustrates how the differential driver in FIG. 17 may be divided into separate driving circuits for each terminal (e.g., positive and negative terminals).

FIG. 31 illustrates the general approach of positive/negative termination drivers for an N-factorial termination network for even and odd n (e.g., number of wires/conductors used).

DETAILED DESCRIPTION

In the following description, specific details are given to provide a thorough understanding of the embodiments. However, it will be understood by one of ordinary skill in the art that the embodiments may be practiced without these specific detail. For example, circuits may be shown in block diagrams in order not to obscure the embodiments in unnecessary detail. In other instances, well-known circuits, structures and techniques may not be shown in detail in order not to obscure the embodiments.

Overview

A power efficient termination network for a differential signaling system is provided. An n-factorial termination network for a differential signal transmitter and/or receiver is optimized to eliminate unnecessary current flows that may occur between differential drivers of a transmitter device. In one example, such optimization may involve splitting a differential driver into positive and negative terminal drivers, and then combining a positive terminal driver and a negative terminal driver from different differential drivers. Because of such combination, unnecessary current flows within the n-factorial termination network may be eliminated.

N-Factorial Differential Signaling

Figure 3:
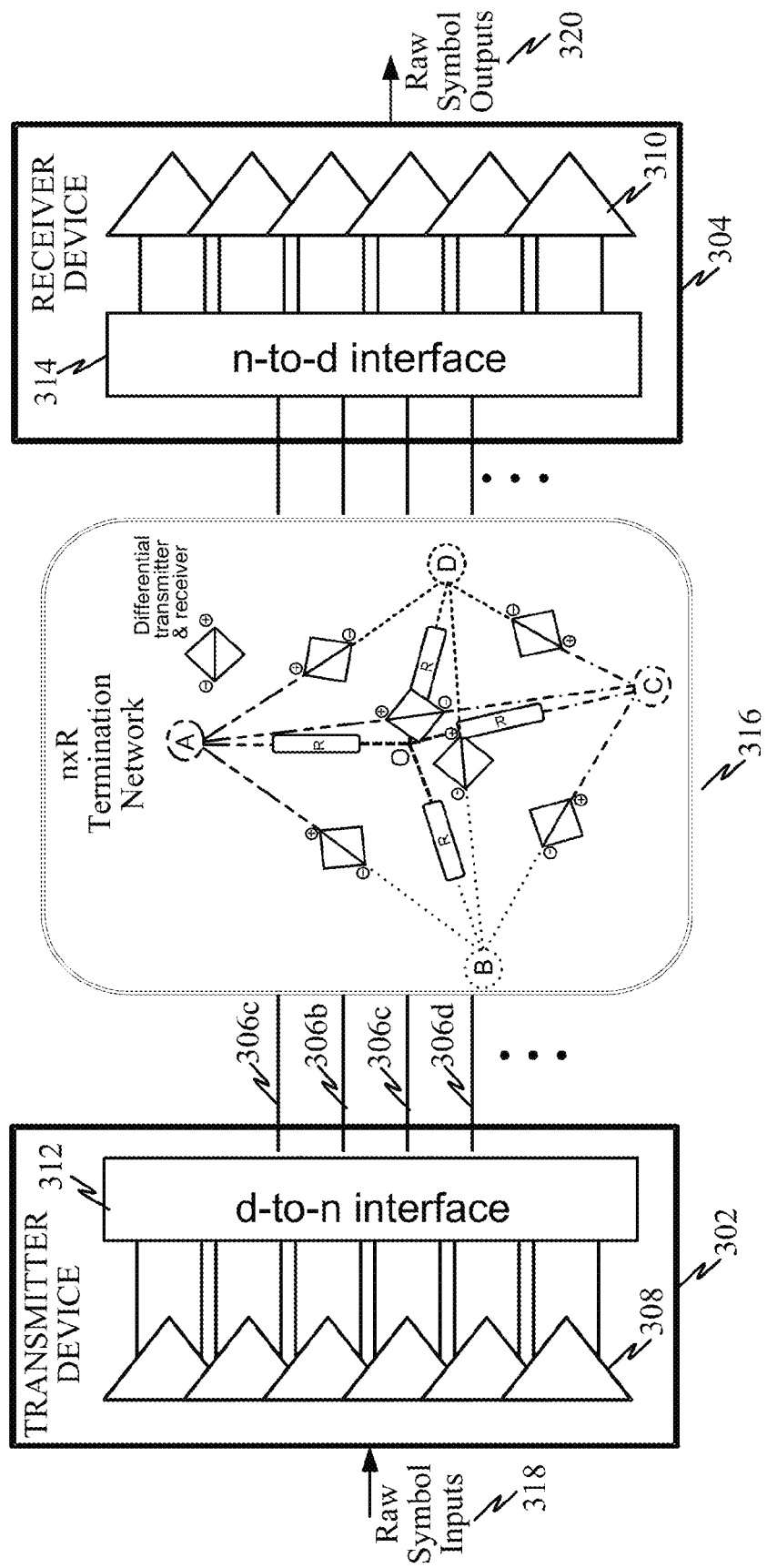
FIG. 3 illustrates an N-factorial differential signaling system.

FIG. 3 illustrates an N-factorial differential signaling system. A transmitter device 302 may include a plurality of differential drivers 308 coupled to a d-to-n interface 312, the d-to-n interface 312 coupled to a plurality of wires/conductors 306a, 306b, 306c, and 306d. A receiver device 304 may include an n-to-d interface 314 coupled to the plurality of wires/conductors 306a, 306b, 306c, and 306d and a plurality of differential receivers 310. In this approach, an n×R termination network 316 may be implemented by the drivers 308 and d-to-n interface 312 at the transmitter device 302 and the n-to-d interface 314 and receivers 310 at the receiver device 304, to more efficiently transmit differential signals across the wires/conductors 306a, 306b, 306c, and 306d. Note that as used and described herein, the term "termination network" refers to an arrangement and/or configuration of resistance elements between drivers and/or receivers, this "termination network" is distinct from the characteristic impedance of a conductor/wire and/or matching termination that is sometimes used along a conductor/wire to avoid/minimize signal reflections. Consequently, the "termination network" is present on the driver/receiver side rather than the conductor/wire side.

The transmitter device 302 receives raw symbol inputs 318, encodes them into differential signals, and transmits them to the receiver device 304 via a combination of wires/conductors 306a, 306b, 306c, and 306d. The receiver devices 304 receives the differential signals via the wires/conductors 306a, 306b, 306c, and 306d, decodes the differential signals, and provides raw symbol outputs 320.

Figure 1:
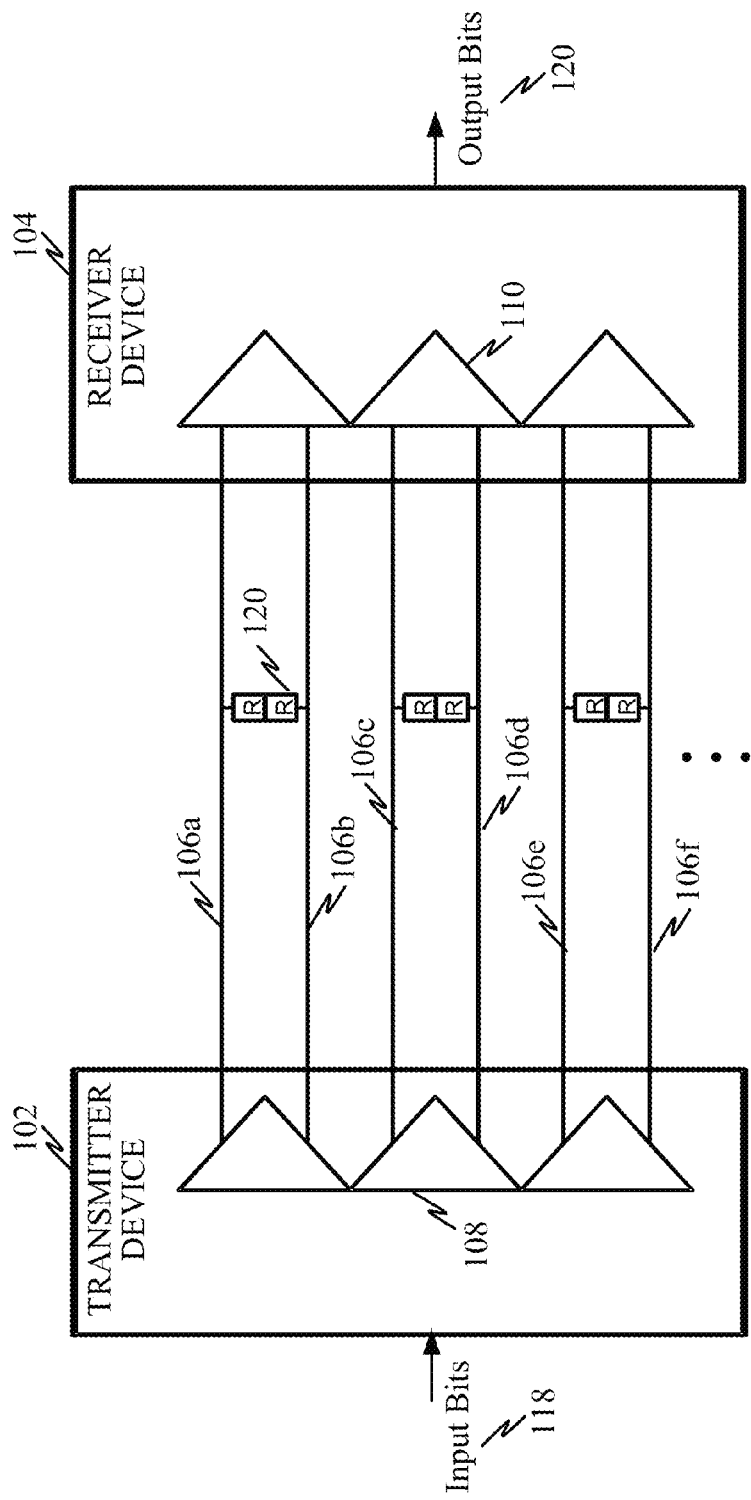
Figure 2:
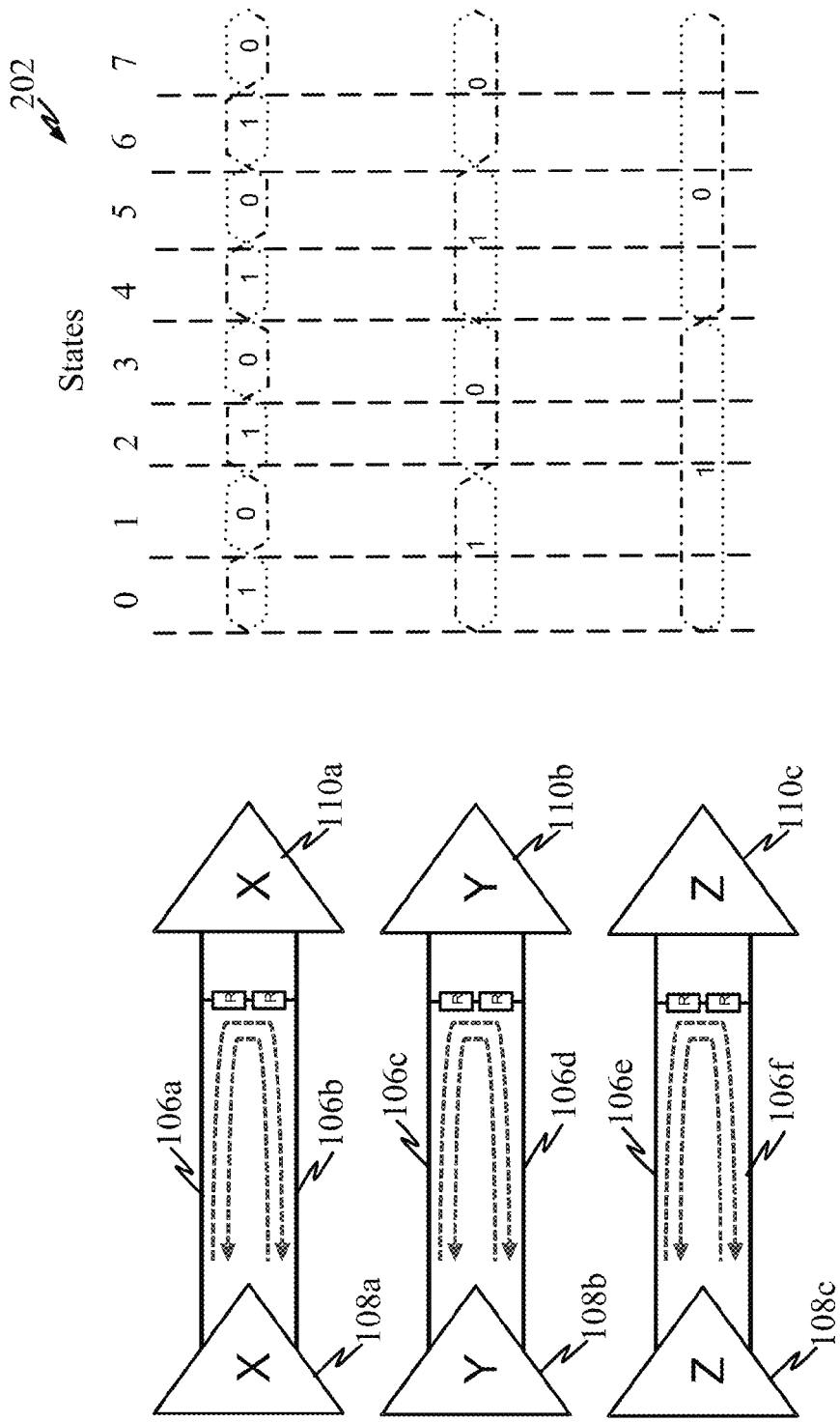

In this termination network 316 differential signaling system, n wires are used and are capable of transmitting up to n! states (or $\log_2 n!$ bits) per cycle. This is significantly more efficient than the typical differential signaling system of FIGS. 1 and 2. For example, for a 6 conductor system, the typical differential signaling system of FIGS. 1 and 2 can transmit 6/2=3 bits per cycle while the star terminal network differential signaling system of FIG. 3 may transmit $\log_2 (6!)$ 9.49 bits per cycle.

Figure 4:
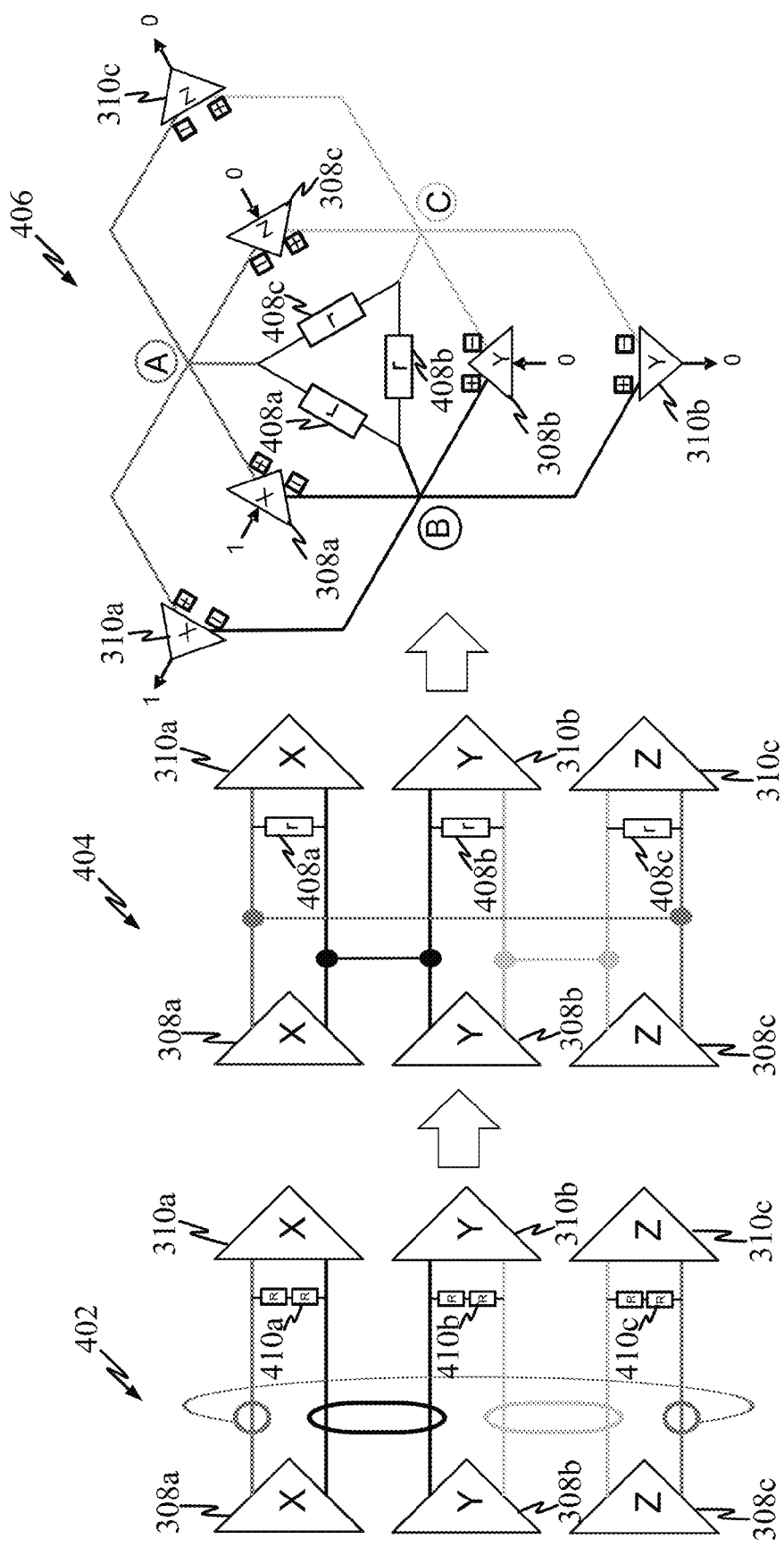
FIG. 4 illustrates the progressive adaptation of a six (6) wire/conductor traditional differential signaling system into a three (3) wire/conductor system by using an triangle termination network.

FIG. 4 illustrates the progressive adaptation of a six (6) wire/conductor traditional differential signaling system 402 into a three (3) wire/conductor system by using an triangle termination network 406. Starting with the traditional differential signaling system 402, conductors from different differential pairs are combined to reduce the total wires/conductors used. Such combination, illustrated in the combined/shorted circuit 404, may be performed by coupling or shorting 404 a wire/conductor from one differential pair with a wire/conductor from another differential pair. The resulting combined/shorted circuit 404 may be redrawn into a triangle termination network 406. However, the resistances R 410a, 410b, and 410c for the different differential pairs is now replaced with equivalent resistances "r" 408a, 408b, and 408c in the combined/shorted circuit 404 and the triangle termination network 406.

Figure 5:
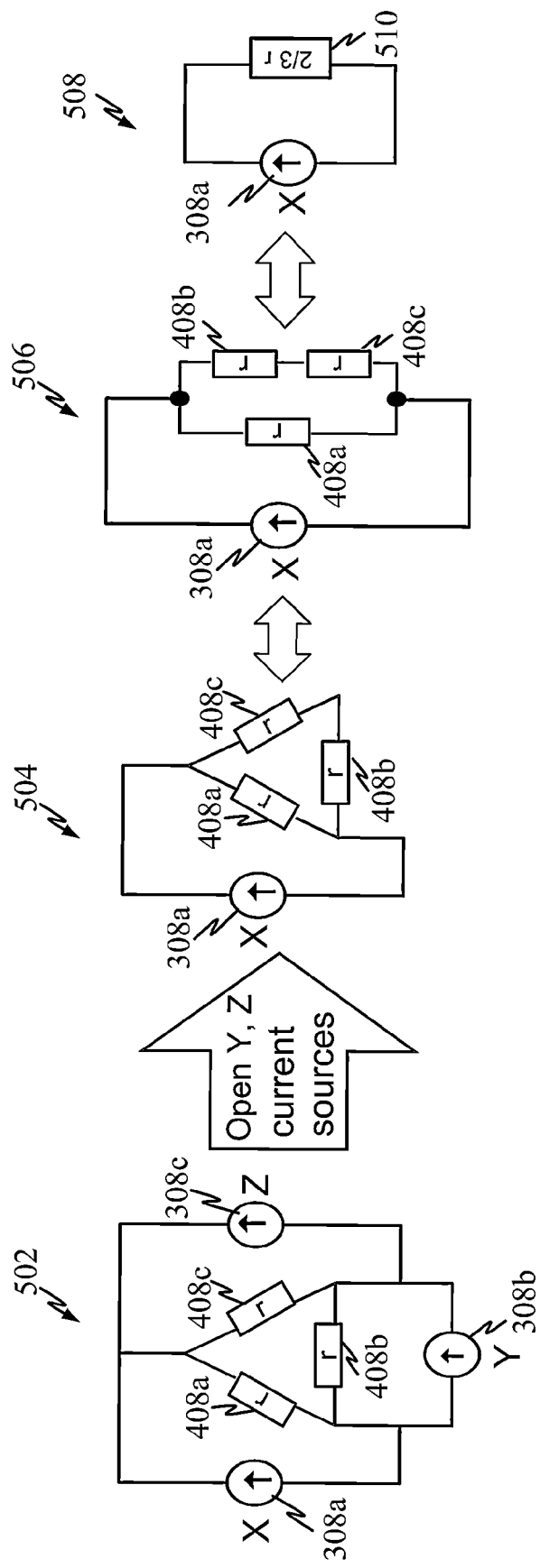
FIG. 5 illustrates how the equivalent resistance "r" may be obtained for the triangle termination network.

FIG. 5 illustrates how the equivalent resistance "r" may be obtained for the triangle termination network 406. A first circuit 502 illustrates the triangle driver termination circuit portion of the termination network 406. A second circuit 504 shows the first circuit 402 with the drivers Y 308b and Z 308c removed or open. A third circuit 506 shows the second circuit 504 redrawn, with a first resistance r 408a in parallel with series resistances 408b and 408c. A fourth circuit 508 shows the third circuit 506 redrawn, with a single equivalent resistance 2/3 r 510.

Figure 6:
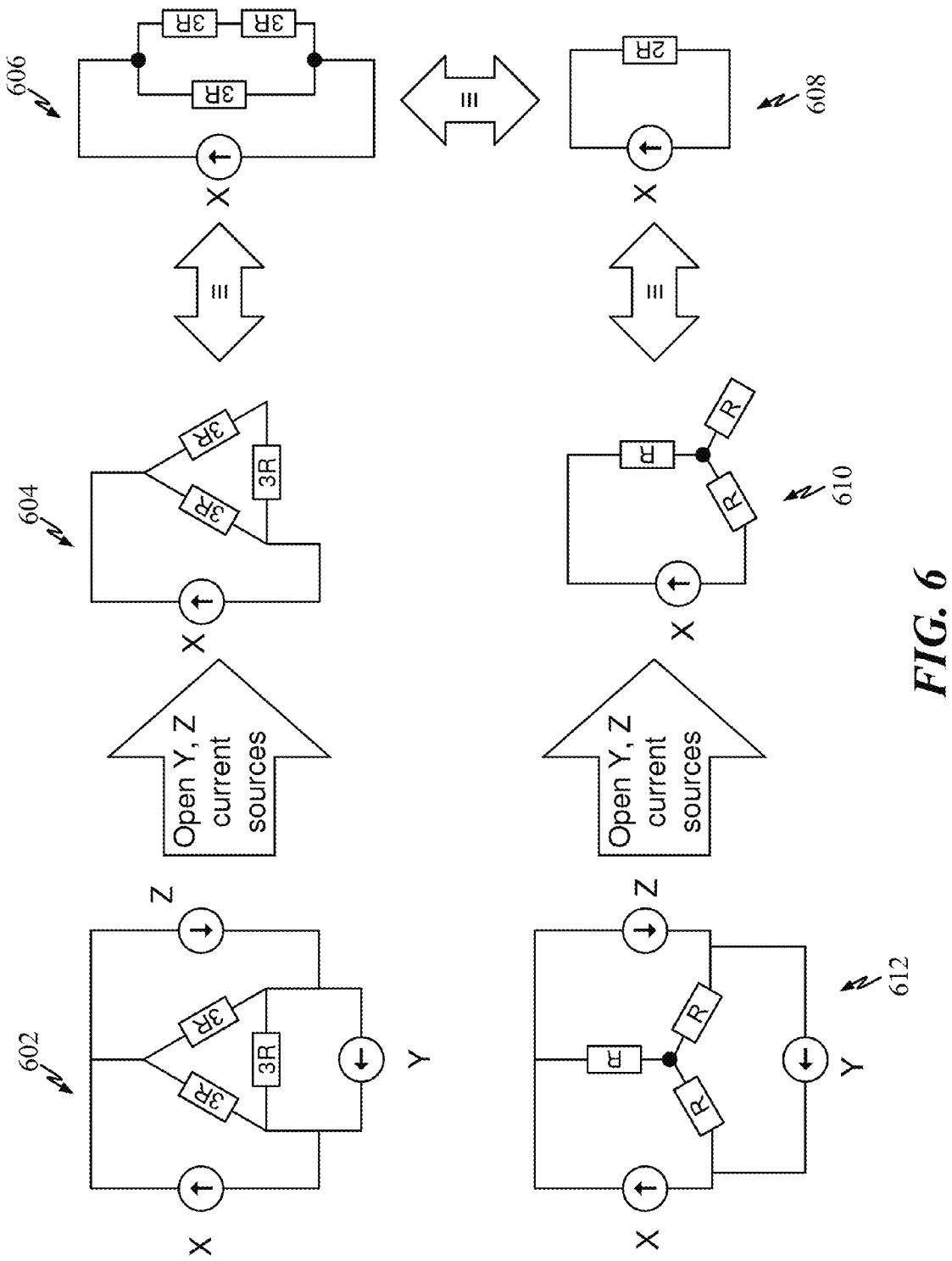
FIG. 6 illustrates how an equivalent star termination network may be obtained from a triangular termination circuit.

FIG. 6 illustrates how an equivalent star termination network 612 may be obtained from a triangular termination circuit 602. The triangular termination circuit 602 is equivalent to the first circuit 502 (FIG. 5) and the triangle termination circuit portion of the triangle termination network 406 (FIG. 4). The conversion between circuits 602, 604, 606, and 608 is equivalent to the conversion between circuits 502, 504, 506, and 508 of FIG. 5. It is apparent that the fourth circuit 508 and the circuit 608 are the same if 2/3 r=2R or r=3R. The star termination network 612 may be converted to a second star termination circuit 610 by removing or opening the drivers Y 308b and Z 308c.

Figure 7:
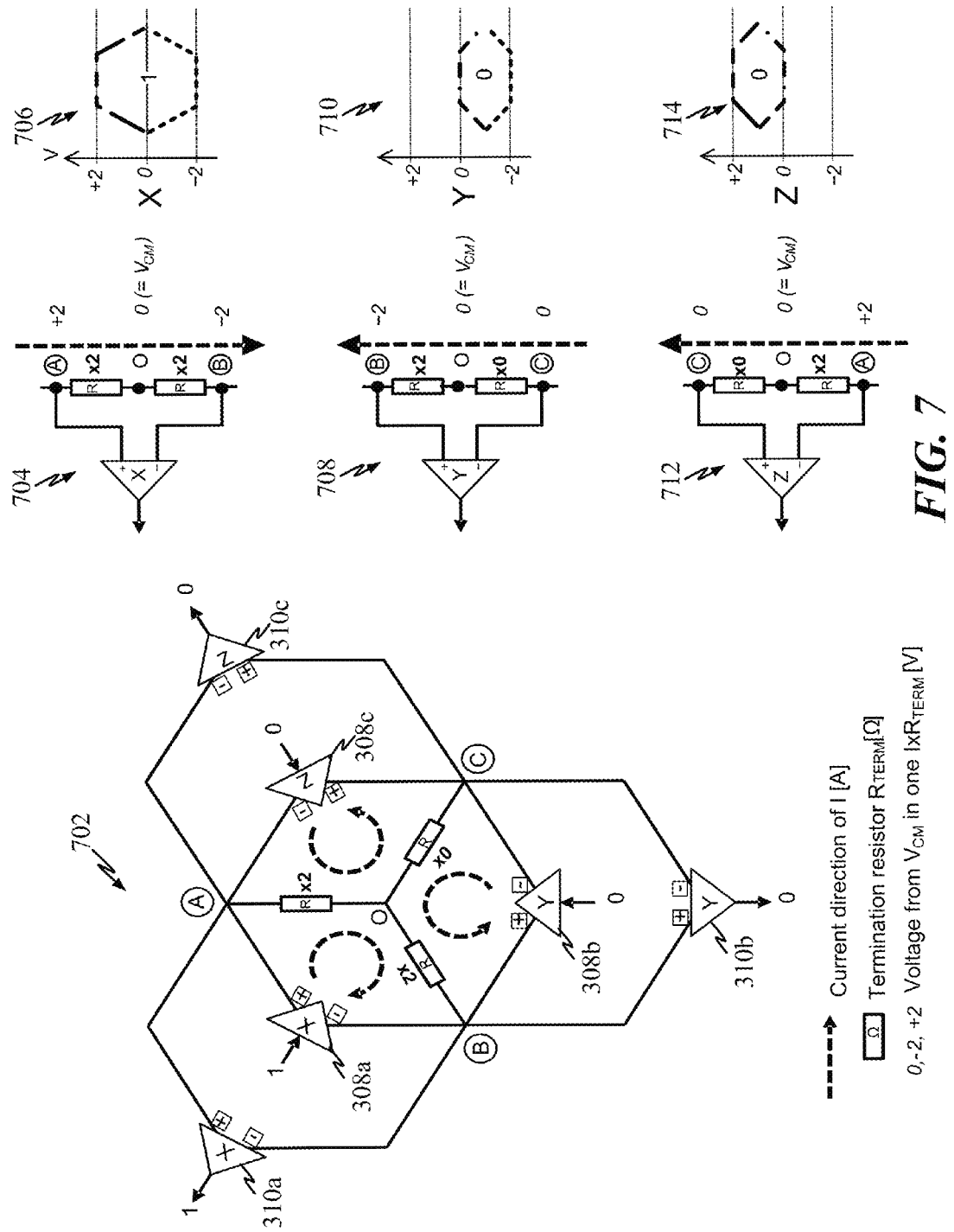
FIG. 7 illustrates a star termination network equivalent to the termination network in FIG. 4.

FIG. 7 illustrates a star termination network 702 equivalent to the termination network 406 in FIG. 4. From the circuit equivalence illustrated in FIGS. 5 and 6, the termination network 406 in FIG. 4 can be redrawn as the equivalent star termination network 702. For each of the three differential drivers 308a, 308b, and 308c, the transmission of bits 1 (at driver X 308a), 0 (at driver Y 308b), and 0 (at driver Z 308c) is illustrated for common mode voltages −2, 0, and +2.

Figure 8:
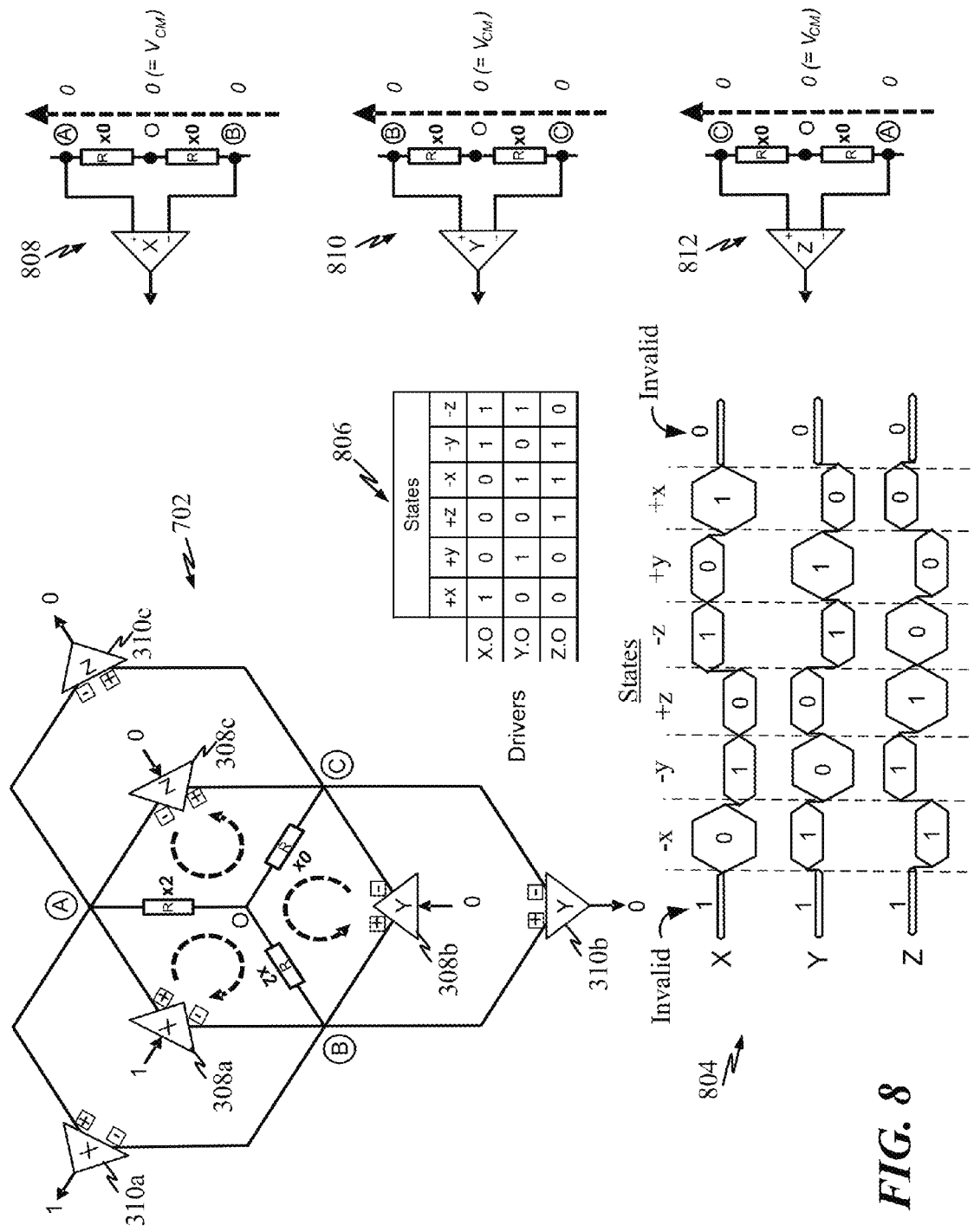
FIG. 8 illustrates the operation of the star termination network in FIG. 7 to generate various signal states depending on the inputs at the transmission drivers.

FIG. 8 illustrates the operation of the star termination network 702 in FIG. 7 to generate various signal states depending on the inputs at the transmission drivers. As illustrated in the state diagram 804, each combination of inputs to drivers X 308a, Y 308b, and Z 308c generates a unique set of differential signals, except when all inputs are 000 or 111. The input combinations 000 or 111 are considered invalid because they produce a zero voltage differential and cannot be distinguished from each other at a receiver. The remaining combinations of inputs may be referred to as states +x, +y, +z, −x, −y, and −z as illustrated in table 806.

The star termination network 702 can use a total of six (6) states: 001 (+z), 010 (+y), 100 (+x), 110 (−z), 101 (−y), 011 (−x), which can be transferred with only three (3) wires/conductors. This is equivalent to $\log_2 6$=2.58 bits of information per cycle. In comparison, traditional differential signaling can send only four (4) states: 00, 01, 10, 11; over four (4) wires/conductors. This is equivalent to $\log_2 4$=2 bit of information per cycle. Consequently, the star termination network 702 increases the amount of information that is transmitted per wire/conductor used.

Figure 9:
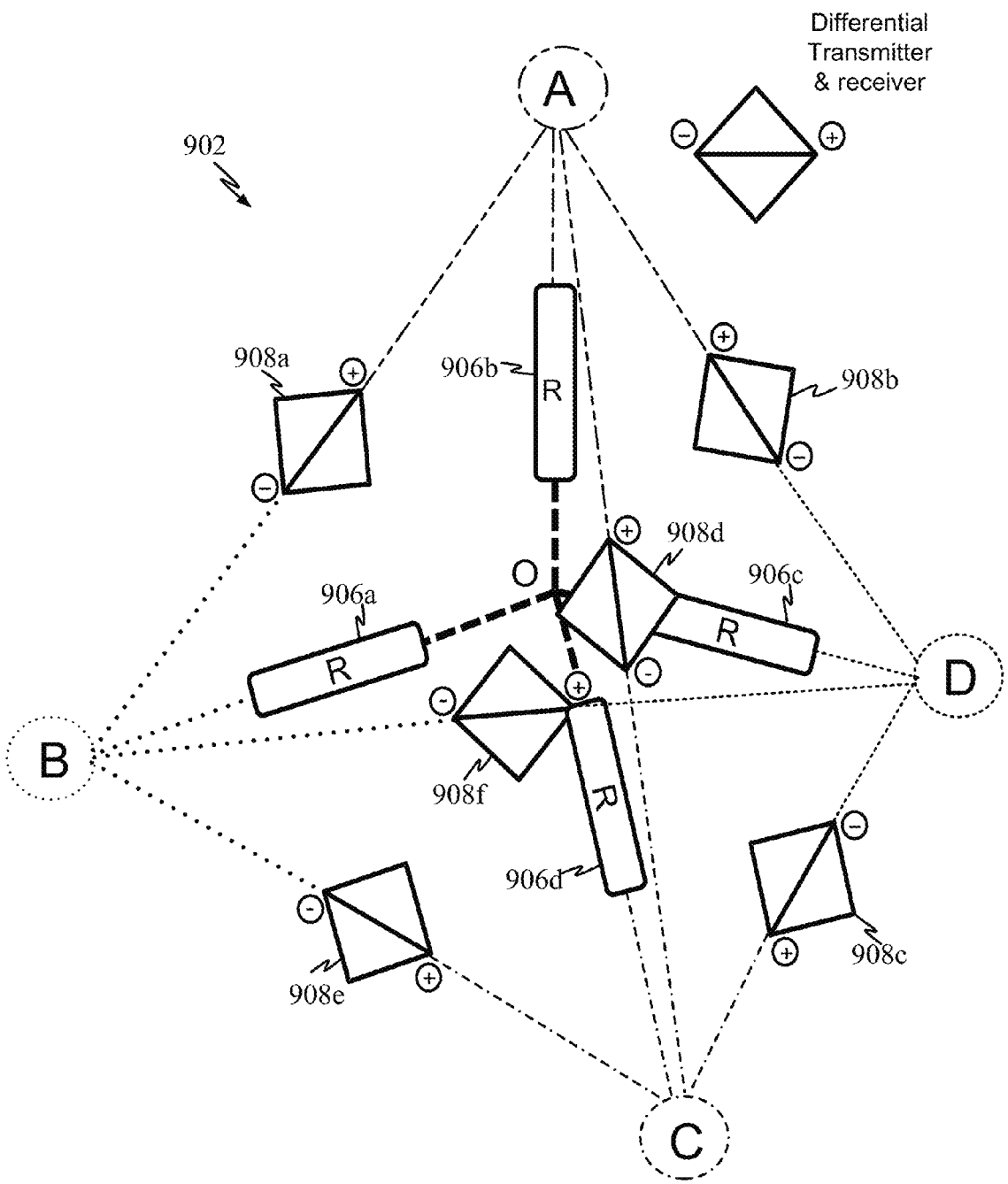
FIG. 9 illustrates how the 3-wire star termination network of FIG. 7 may be expanded to a 4-wire tetrahedron termination network.

FIG. 9 illustrates how the 3-wire star termination network 702 of FIG. 7 may be expanded to a 4-wire tetrahedron termination network 902. The tetrahedron termination network 902 may be illustrated with four (4) vertices A, B, C, and D, with each vertex connecting one end of a termination resistance R 906a, 906b, 906c, and 906d, while the other end of all termination resistances R are coupled together at a node O. The six (6) edges of the tetrahedron termination network 902 may be defined from the vertices lines AB, CD, AC, AD, CB, and DB. Each of these edges has one differential driver 908a, 908b, 908c, 908d, 908e, and 908f (comprising a differential transmitter or driver and a differential receiver or sink). Each termination resistance R is coupled to three (3) of the differential drivers.

Figure 10:
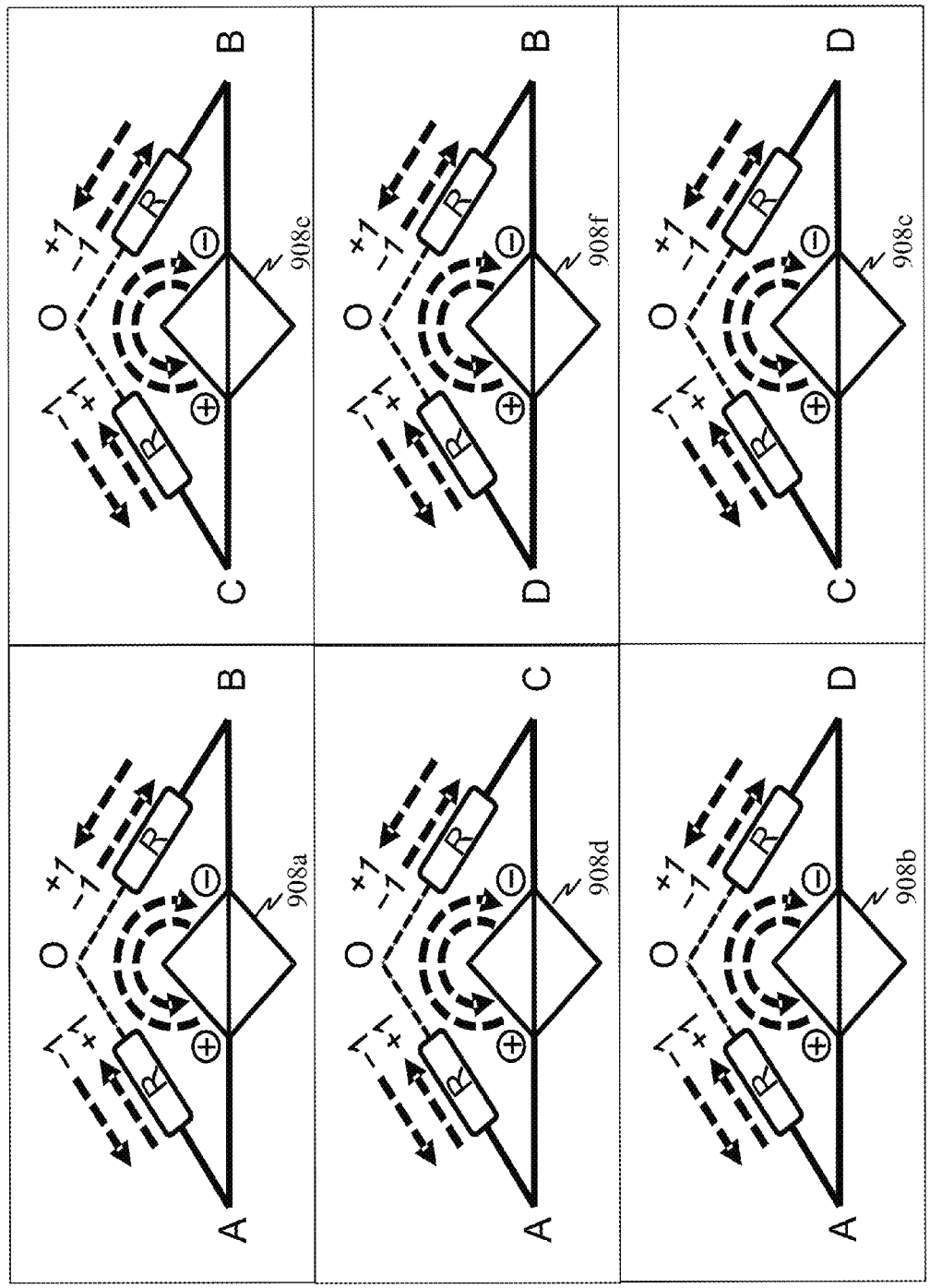
FIG. 10 illustrates the possible flow of a unitary current among the different nodes and resistances for each differential driver of the tetrahedron termination network of FIG. 9.

FIG. 10 illustrates the possible flow of a unitary current among the different nodes and resistances for each differential driver 908a, 908b, 908c, 908d, 908e, and 908f of the tetrahedron termination network 902.

FIG. 11 illustrates a table 1102 of the possible unitary current flows across each termination resistance R of the tetrahedron termination network 902 of FIG. 9. As can be observed from the tetrahedron termination network 902, each termination resistance R is coupled to three (3) drivers/sinks. Assuming a unitary current of +1 or −1 from each driver/sink, then table 1102 illustrates the possible net current flows for each termination resistance R: +3, +1, −1, −3.

The input signals to the differential drivers 908a, 908b, 908c, 908d, 908e, and 908f of the tetrahedron termination network 902 of FIG. 9 may have 64 possible states (i.e., six drivers and $2^6$ states). However, as further described with reference to FIG. 12, of the 64 possible states, 40 may be considered illegal states because they result in zero differential voltages (as illustrated in FIGS. 12A and 12B). In one example, the differential voltage of a differential driver 908a becomes zero (0) when two resistors 906a and 906b have currents of the same size and same direction (e.g., from A to O and from B to O, or from O to A and from B to B).

FIG. 12 (comprising FIGS. 12A and 12B) is a table showing the various combinations of raw symbols and those symbols having zero differential voltage for a 4-wire tetrahedron termination network 902. This table may be interpreted with respect to the 4-wire tetrahedron termination network of FIGS. 9 and 10. Here the raw symbols (Sraw) refer to the raw symbols formed by the differential signals at CD, DB, AD, AC, CB, and AB, in FIG. 10. The voltage at each resistance R refers to the voltage across each resistance R between the central node O and each node A, B, C, or D in the tetrahedron termination network 902 in FIG. 9. In this example, assuming a unitary resistance R, the voltage across each resistance Rterm is given as +3, +1, −1, or −3 as in the possible currents in table 1102 in FIG. 11. As a result of these voltages across each resistance R, a differential voltage across each differential driver (from DB, CD, AD, AC, CD, and AB), can be ascertained in the tetrahedron termination network 902 in FIG. 9. In some cases, the voltages across two resistances R for a given differential driver (transmitter/receiver) cancel each other out, resulting in a "0" differential voltage. As a result, such conditions are undistinguishable from each other. Where such conditions occur, the differential signals are undecodable/indistinguishable and considered "illegal" and not used.

FIG. 13 is a table showing the valid raw symbols from the table in FIG. 12 having a non-zero differential voltage for the 4-wire tetrahedron termination network 902.

This type of termination network is herein referred to as an "N-factorial", where n=4 in the case of the tetrahedron termination network 902. As can be appreciated from tables in FIGS. 11 and 12, any time two resistances R have of the same magnitude and direction, their differential voltage becomes zero (0) and is considered an illegal state (e.g., the corresponding raw symbol in which such illegal state occurs cannot be used). For instance, in FIG. 12A, for the raw symbol "000001", the voltage drop across the resistances R for DO and BO are equal to 1 (assuming a unitary current and resistance) and the resistances R for CO and AO are equal to −1. This results in a differential voltage of zero (0). Consequently, valid/legal states are found where no two resistances R have currents of the same magnitude and direction. For the case where four wires/conductors are used (n=4), there are 4 resistances R, and 4 possible current magnitudes/direction (+1/+1, +1/−1, −1/+1, −1/−1). A legal state is achieved when each of the possible 4 different current sizes {−3, −1, +1, +3} are assigned to each of the four resistances Rs {DO, CO, BO, AO}. In the case where n=4, the total number of states that are legal/valid (no zero differential voltage) are 4!=24.

This N-factorial termination network can be expanded to any number of wires/conductors. In general, for n wires/conductors, there are n resistances R, and n possible current magnitudes/directions. A legal/valid state is achieved when each of the possible n different current magnitudes are assigned to each of the n resistances R. Consequently, for n wires/conductors the total number of states that are legal/valid (no zero differential voltage) are n!.

FIG. 14 are two tables comparing the efficiency with which information may be transmitted using a traditional differential signaling approach and a N-factorial differential signaling approach. For instance, in a first table 1402 a traditional differential signaling approach (as in FIGS. 1 and 2) may transmit 3 bits per cycle using six (6) wires/conductors using eight (8) states per cycle, one differential voltage level, and three (3) drivers/receivers. By contrast, a second table illustrates an N-factorial differential signaling approach, where, for example, if n=6 wires/conductors, 9.49 bits per cycle can be transmitted using 720 states per cycle, 5 differential voltage levels, and 15 drivers/receivers. Consequently, significantly more information may be transmitted over the same number of wires/conductors per cycle relative to the traditional differential signaling approach.

Power-Conserving N-Factorial Termination Network

As can be appreciated from the termination networks 702 (FIG. 7) and 902 (FIG. 9), all resistances R are coupled together at a common node O. This may result in currents from two or more different drivers (transmitters) interacting across a termination network. For instance, in FIG. 9, a resistance 906a may have currents from three drivers 908a, 908e and 908f. These currents may be additive (if they flow across the resistance in the same direction) or cancelling (if they flow across the resistance in opposite directions).

Figure 15:
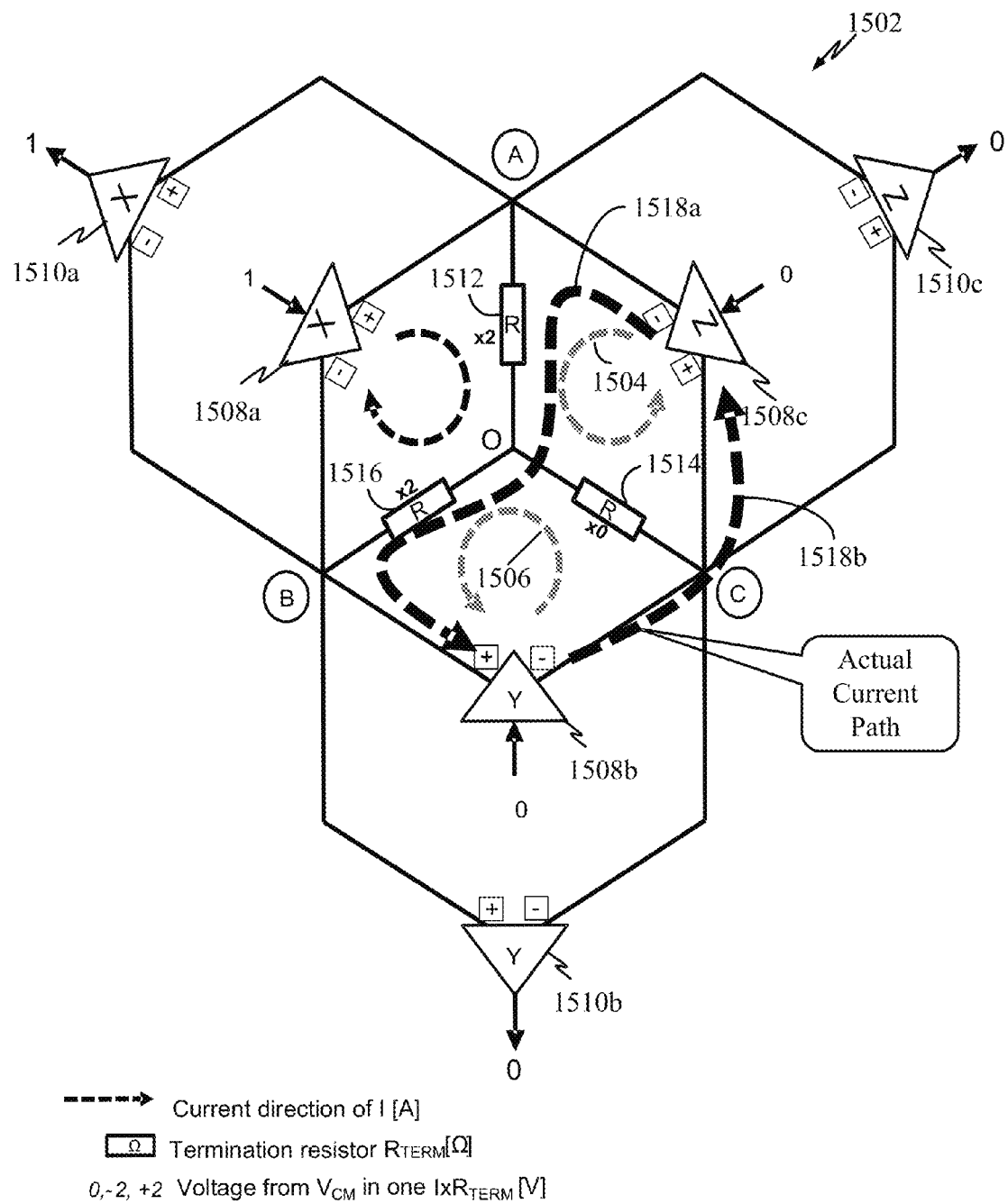
FIG. 15 illustrates current interactions between two drivers for a triangle termination network 1502 (e.g., n=3).

FIG. 15 illustrates current interactions between two drivers for a triangle termination network 1502 (e.g., n=3). As can be appreciated here, a first driver Z 1508c may be driving a first current 1504 through a first resistance R 1512 (AO), through a second resistance R 1514 (CO), and back to the first driver Z 1508c. Similarly, a second driver Y 1508b may be driving a second current 1506 through the second resistance R 1514 (CO), through a third resistance R 1516 (BO), and back to the second driver Y 1508b. However, the opposite currents (first current 1504 and second current 1506) through the second resistor R 1514 (CO) are actually cancelling each other. The combined current flows may best be characterized as a first current flow 1518a from driver Z 1508c to driver Y 1508b and a second current flow 1518b from driver Y 1508b to driver Z 1508c. However, it is evident that the second current flow 1518b is wasted since it conveys no information.

Figure 16:
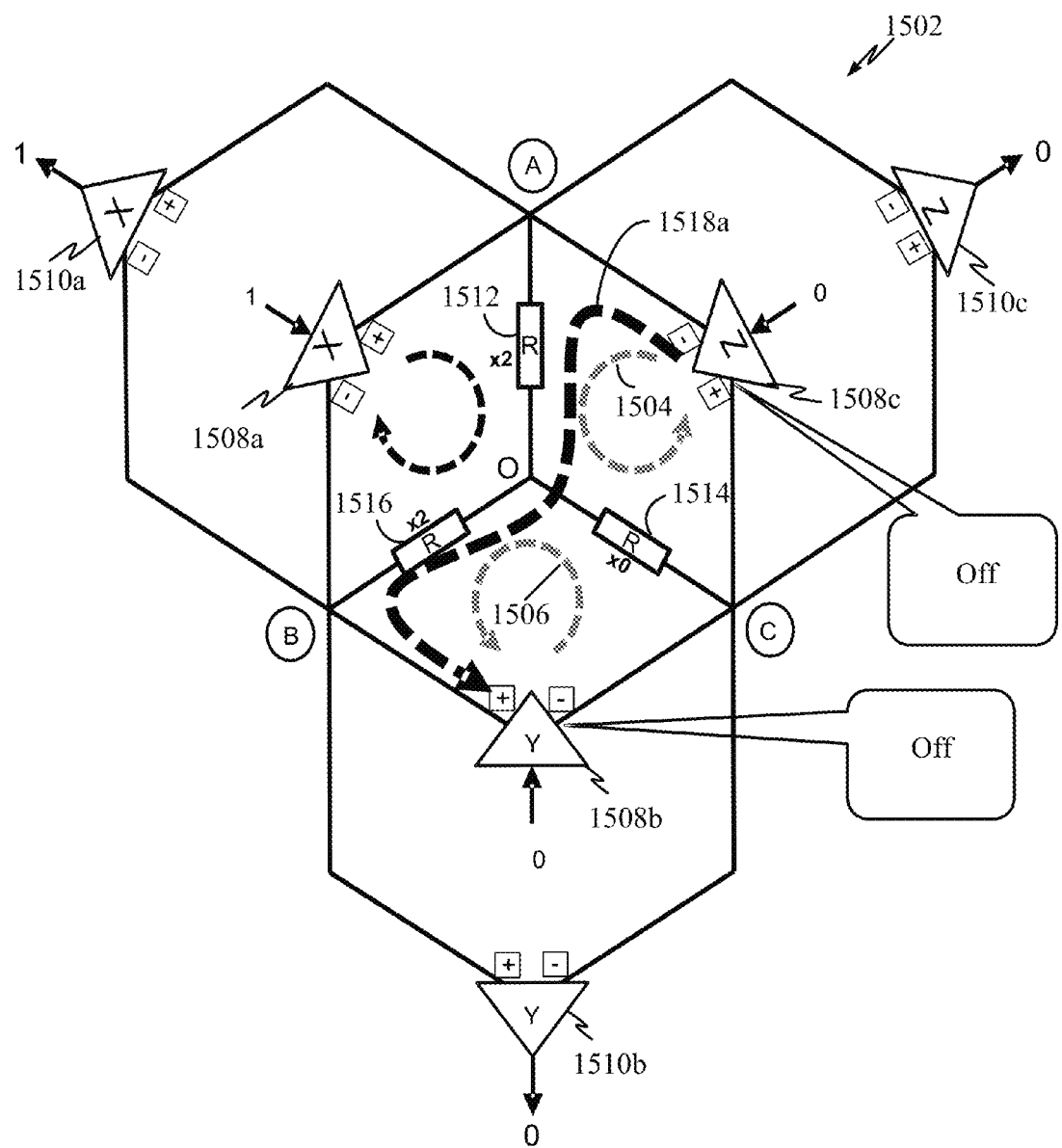
FIG. 16 illustrates current interactions between the two drivers for the triangle termination network of FIG. 15 but where the drivers are configured to selectively turn off one of their terminals to conserve power.

FIG. 16 illustrates current interactions between the two drivers for the triangle termination network 1502 of FIG. 15 but where the drivers are configured to selectively turn off one of their terminals to conserve power. As illustrated here, the first driver 1508c has shut off its positive terminal and the second driver 1508b has shut off its negative terminal, thereby preventing the second current flow 1518b from occurring.

Figure 17:
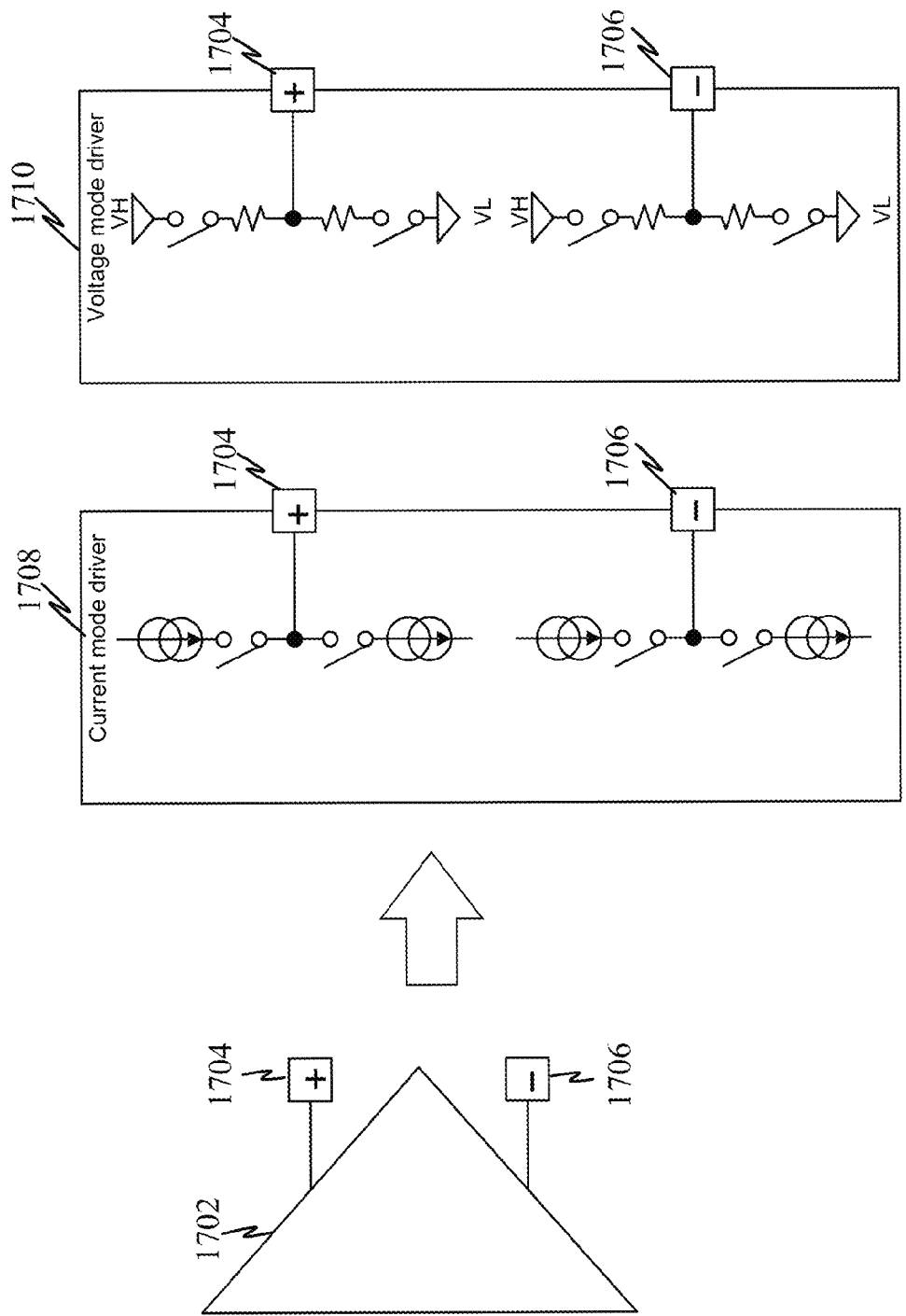
FIG. 17 illustrates a typical differential driver circuits.

FIG. 17 illustrates a typical differential driver circuits. The differential driver 1702 typically includes a positive terminal 1704 and a negative terminal 1706. The differential driver 1702 may be a current mode differential driver 1708 or a voltage mode differential driver 1710. However, the positive terminal 1704 and the negative terminal 1706 are separate driving circuits which are switched high or low (i.e., push or pull) depending on the current flow desired.

FIG. 18 illustrates how the differential driver in FIG. 17 may be divided into separate driving circuits for each terminal (e.g., positive and negative terminals). For instance, the current mode differential driver 1708 may be divided into a positive terminal current mode driver 1808a and a negative terminal current mode driver 1808b. Similarly, the voltage mode differential driver 1710 may be divided into a positive terminal voltage mode driver 1810a and a negative terminal voltage mode driver 1810b. Consequently, the different terminals of a differential driver can be shut off or on independent of its other terminal.

Figure 19:
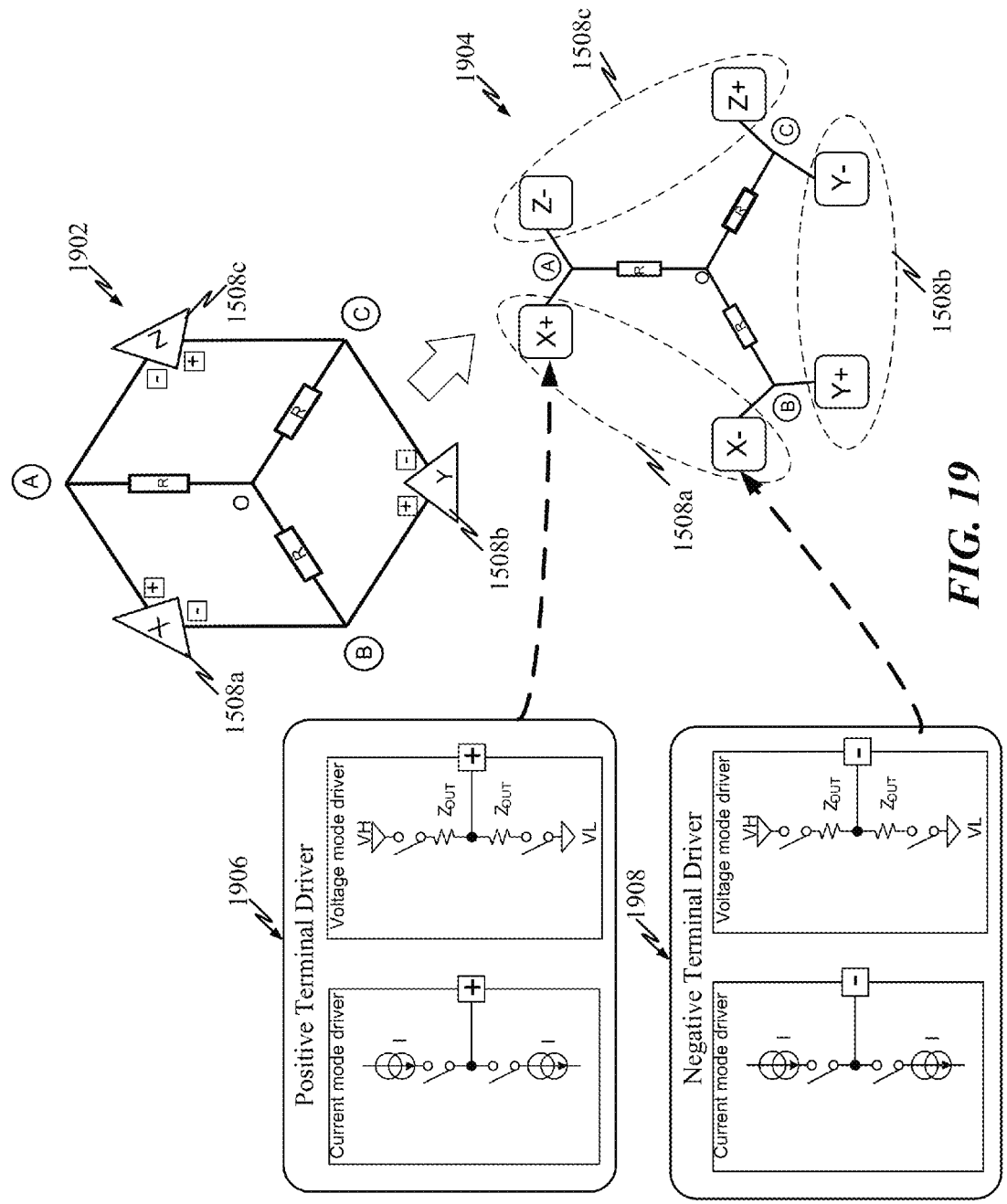
FIG. 19 illustrates the transformation of a driver circuit for a termination network for improved power efficiency.

FIG. 19 illustrates the transformation of a driver circuit for a termination network for improved power efficiency. A driver circuit portion 1902 of the termination circuit 1502 is transformed by first separating the positive terminal driver and negative terminal driver for each driver X 1508a, Y 1508b, and Z 1508c into separate terminal driver circuits. An equivalent driver termination circuit 1904 may then be obtained with separate positive terminal drivers X+, Y+, and Z+ 1906 and negative terminal drivers X−, Y−, and Z− 1908. Consequently, positive terminal drivers may be paired with negative terminal drivers: X+& Z−, Z+& Y−, and X− & Y+.

Figure 20:
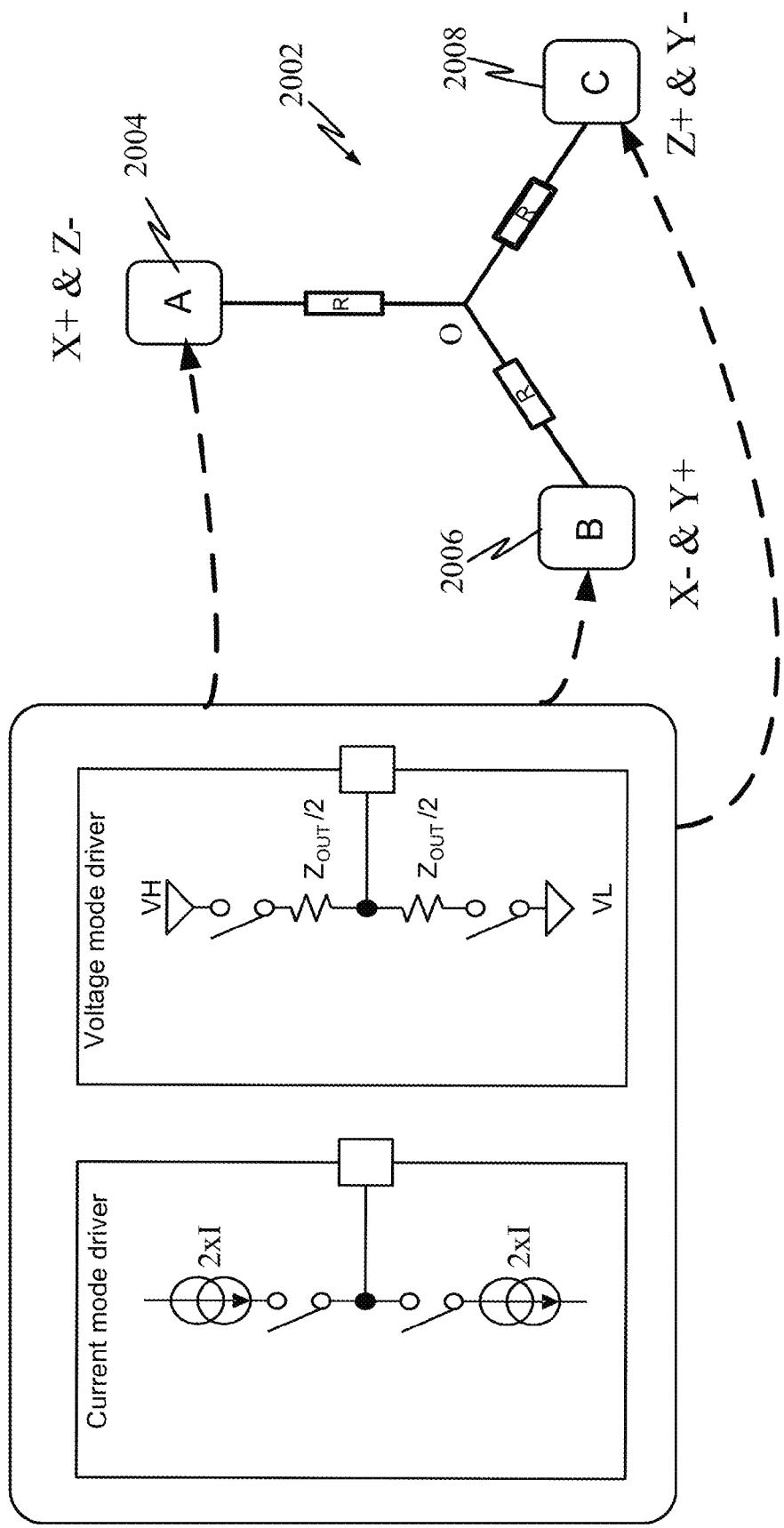
FIG. 20 illustrates how each of the different pairings of positive and negative terminal drivers may be combined into one driver.

FIG. 20 illustrates how each of the different pairings of positive and negative terminal drivers may be combined into one driver. The equivalent driver termination circuit 1904 may be converted into a combined driver termination circuit 2002 in which combined drivers A 2004, B 2006, and C 2008 each combine the paired positive and negative terminal drivers: X+& Z−, Z+& Y−, and X− & Y+.

Figure 21:
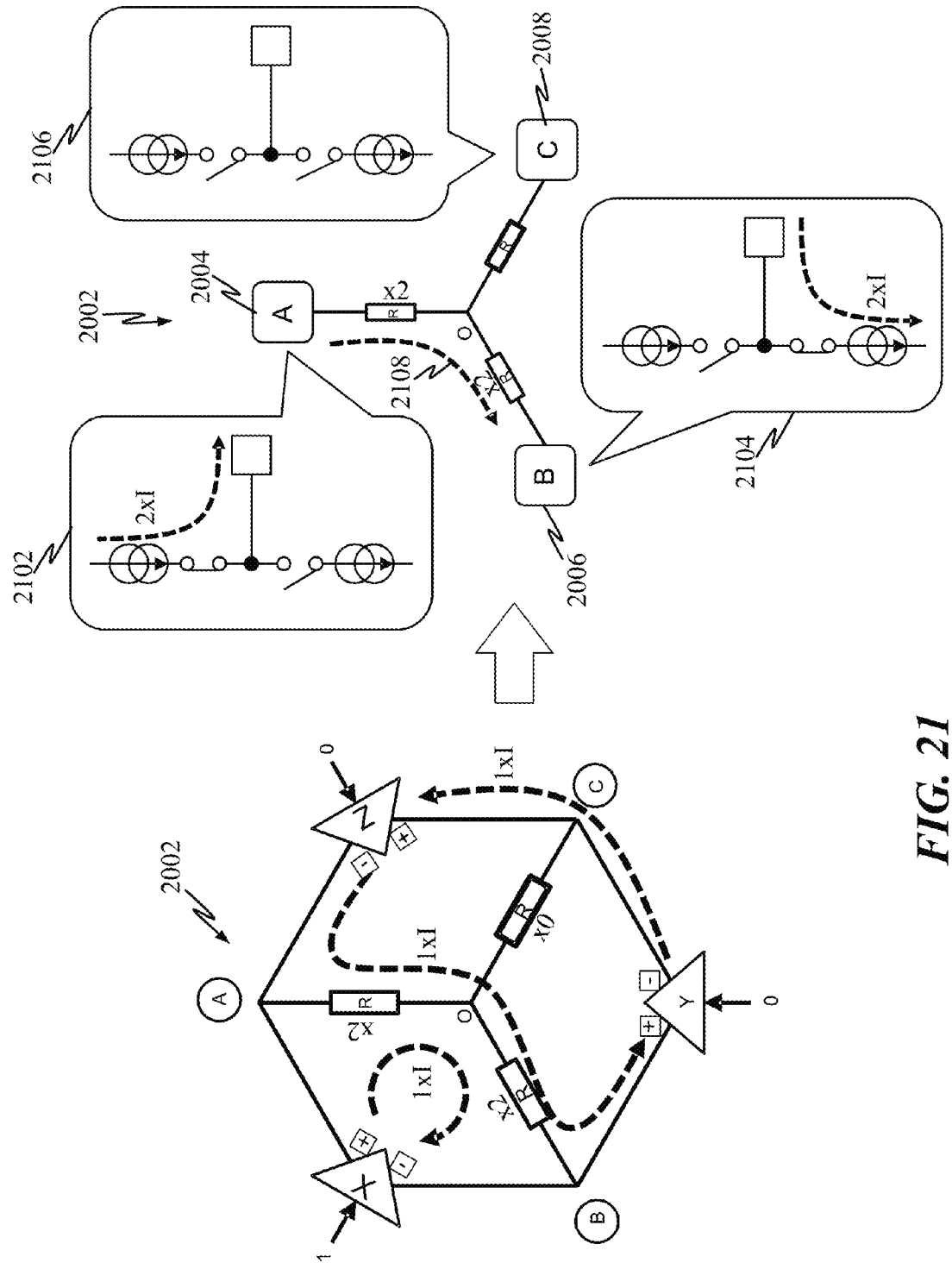
FIG. 21 illustrates how power is saved by converting the driver circuit portion to the combined driver termination circuit.

FIG. 21 illustrates how power is saved by converting the driver circuit portion 1902 to the combined driver termination circuit 2002. In this example, the combined driver A 2004 and combined driver B 2006 are switched to cause a current flow 2108 while combined driver C 2008 is disabled. While the power consumed by the equivalent driver termination circuit 1902 is:

$$P1 = 2 \times I \times (Vcc - Vod) + 1 \times I \times Vcc,$$

where Vcc is the supply voltage, and Vod=R×I×4 (A-B differential voltage),
the power consumed by the combined driver termination circuit 2002 is:

$$P2 = 2 \times I \times (Vcc - Vod),$$

thereby saving 1×I×Vcc in power.

Figure 22:
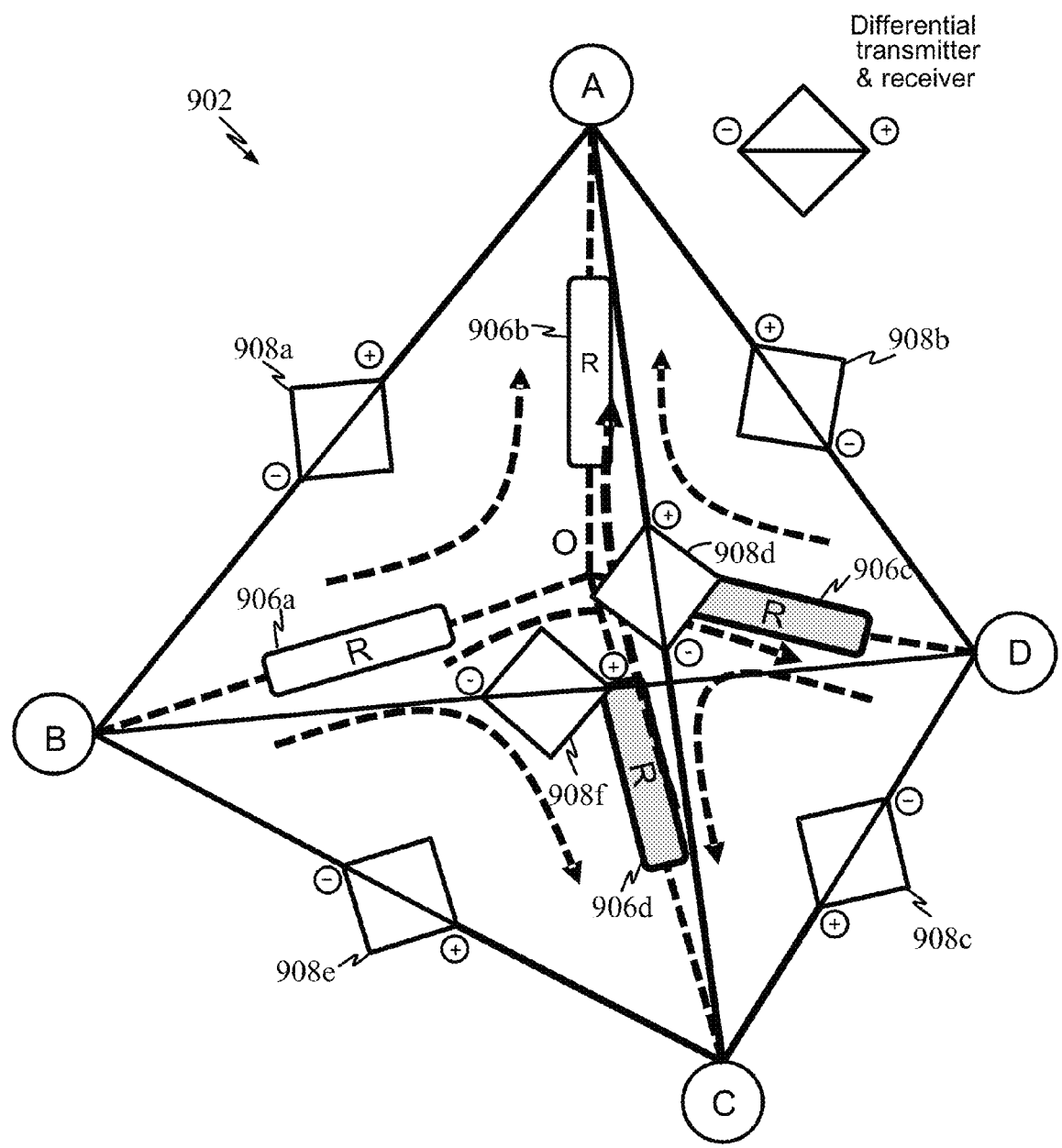
FIG. 22 illustrates a tetrahedron termination network for differential signaling.

FIG. 22 illustrates a tetrahedron termination network for differential signaling. In this example, the tetrahedron termination network of FIG. 9 is shown with various exemplary current flows. The total power consumed by the various current flows is given by:

$$P1 = 1 \times I \times (Vcc - Vod6)(\text{for } AB) + 2 \times I \times (Vcc - Vod4)(\text{for } AD, CB) +$$
$$3 \times I \times (Vcc - Vod2)(\text{for } CD, AC, DB) + 2 \times I \times Vcc(\text{at } C, D),$$

where
$$Vod6 = R \times I \times 6$$
$$Vod4 = R \times I \times 4$$
$$Vod2 = R \times I \times 2.$$

However, the current flows through a first resistance R 906c and second resistance R 906d cancel each other out. Consequently, the current flow from D to C is wasted.

Figure 23:
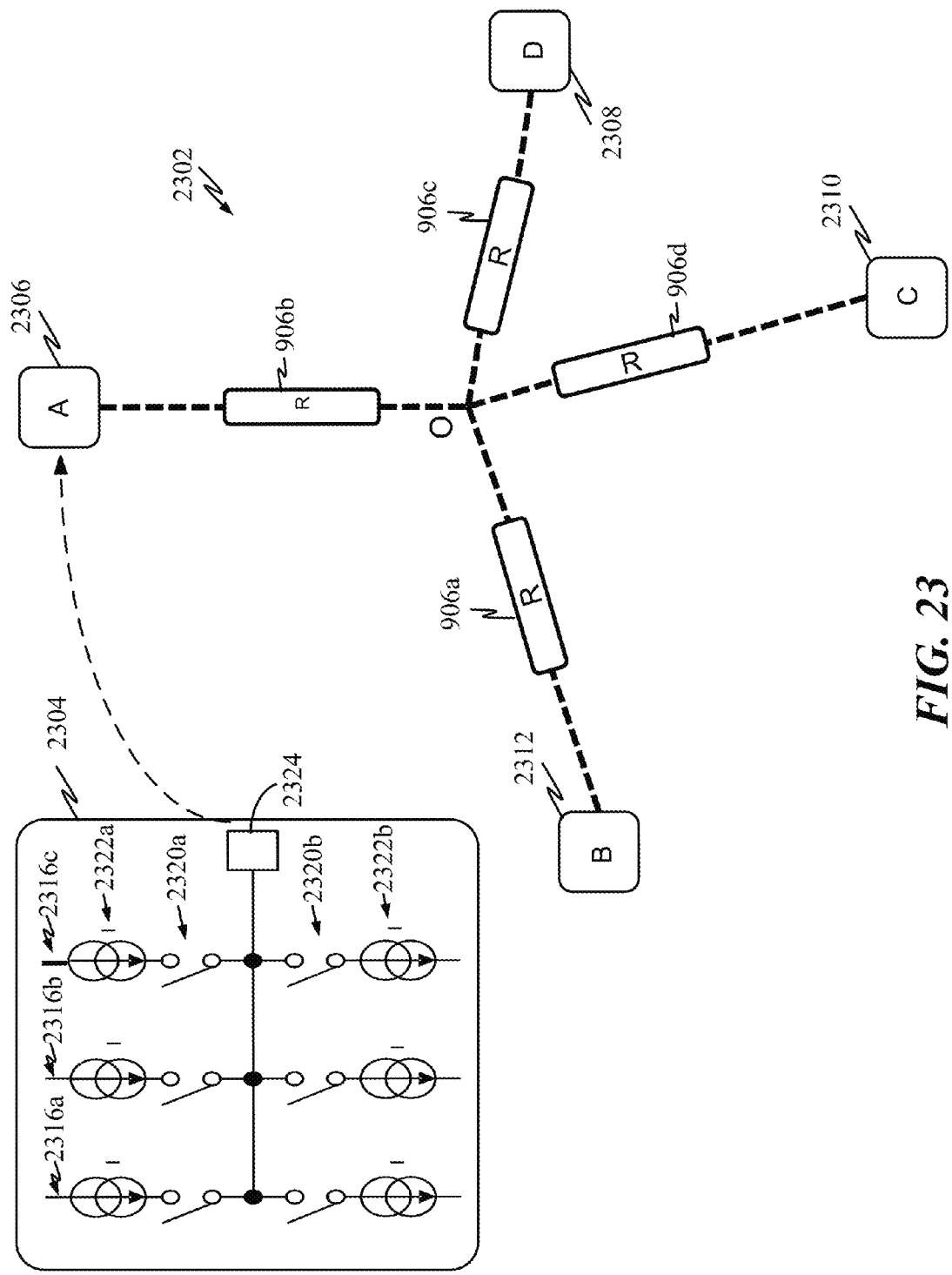
FIG. 23 illustrates a combined driver termination network equivalent to the tetrahedron termination network of FIG. 9.

FIG. 23 illustrates a combined driver termination network 2302 equivalent to the tetrahedron termination network of FIG. 9. As done with the differential drivers in FIG. 21, each combined driver 2306, 2308, 2310, and 2312 in the combined driver termination network 2302 combines a positive termination driver and a negative termination driver from the tetrahedron termination network 902 of FIG. 9. Each combined driver 2306, 2308, 2310, and 2312 may include a plurality of separately switchable circuits that can be individually turned off/on to achieve a desired current flow. In one example, a first combined driver 2304 may include three switchable circuits 2316a, 2316b, and 2316c each providing a unitary current I.

Each of the switchable circuits 2316a, 2316b, and 2316c may be independently controlled so that none, one, two, or three switchable circuits within the first combined driver 2304 may be operational at any one cycle. The switchable circuit 2316c may include current source driver 2322a, a first switch 2320a, a current sink 2322b, and a second switch 2320b. When the first switch 2320a is closed, the second switch 2320b is open and current flows from the current source driver 2322a through the first switch 2320a and out the terminal 2324. When the second switch 2320b is closed, the first switch 2320a is open and current flows into the current sink 2322b from the terminal 2324 via the second switch 2320b. When all switches of the switchable circuits 2316a, 2316b, and 2316c are open, no current flows into or out of the terminal 2324.

Figure 24:
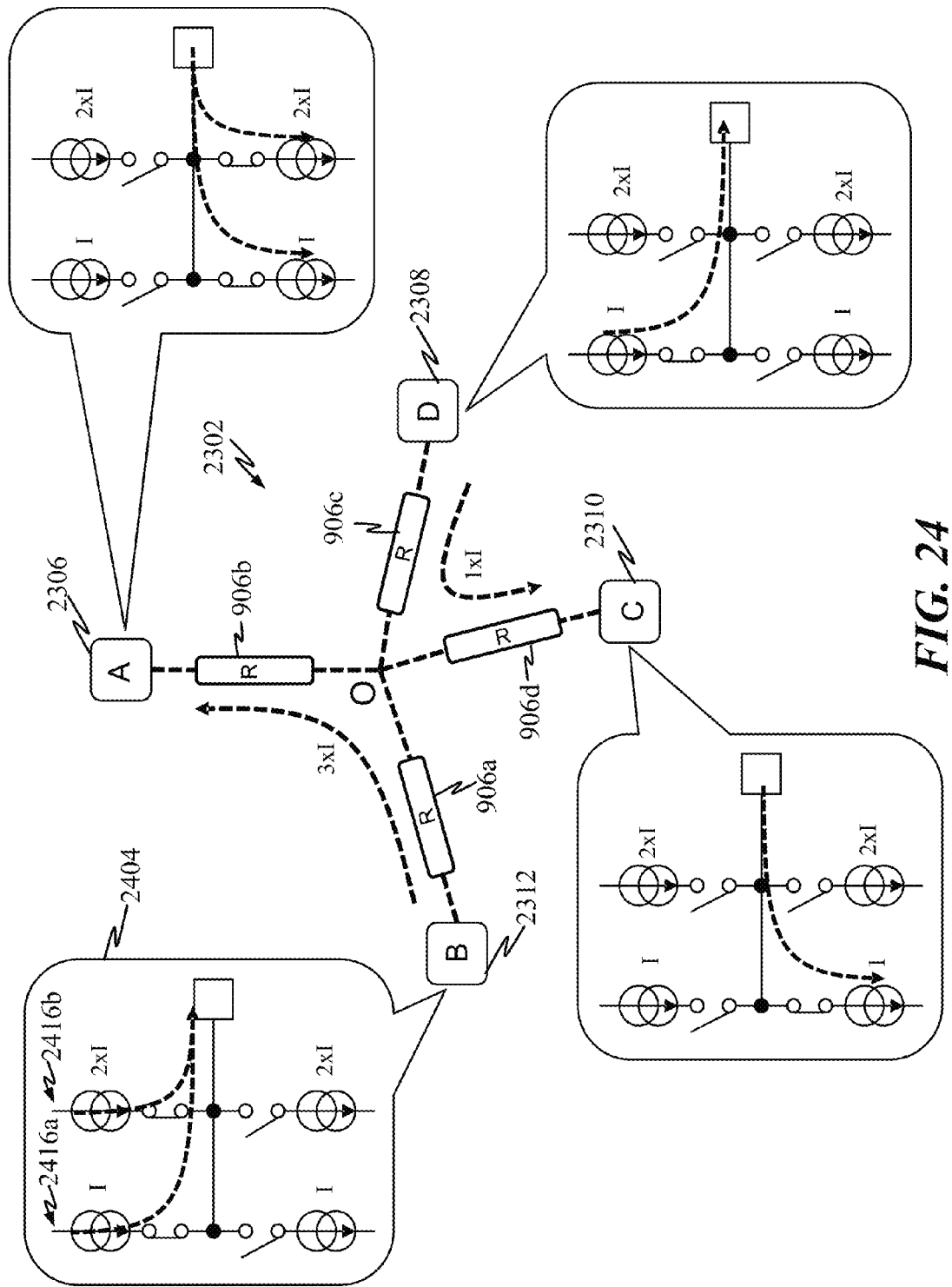
FIG. 24 illustrates an alternative to the combined drivers of FIG. 23.

FIG. 24 illustrates an alternative to the combined drivers of FIG. 23. In this example, the three unitary current circuits 2316a, 2316b, and 2316c of FIG. 23 have been replaced a driver 2404 including a first switchable circuit 2416a providing a unitary current I and a second switchable circuit 2416b providing a 2×I current. This may permit reducing the number of circuits used while still providing either 1×I or 3×I current flows. The actual magnitudes of the current flows provided by a switchable circuit may be specific to each implementation.

Figure 25:
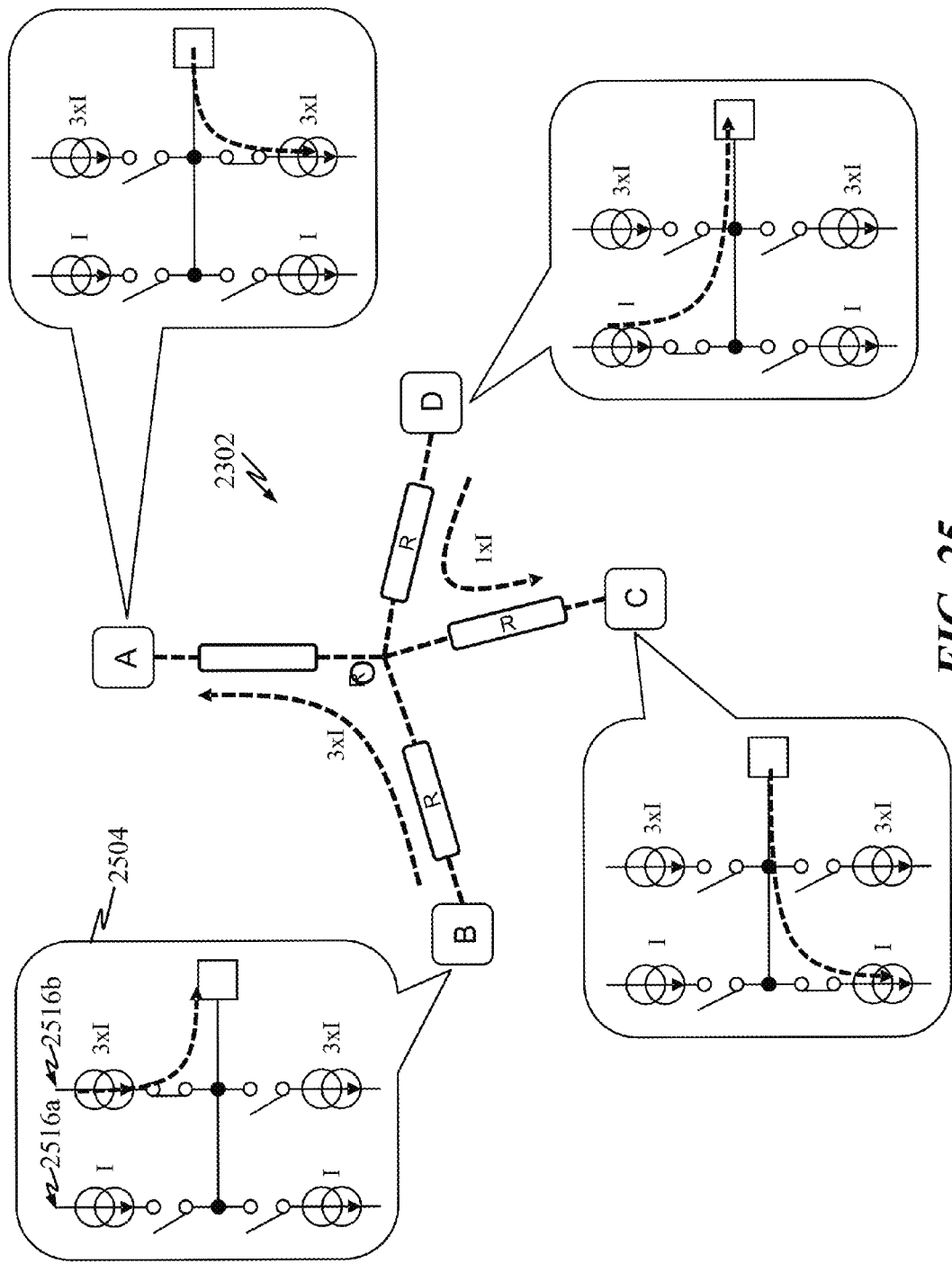
FIG. 25 illustrates another alternative to the combined drivers of FIG. 23.

FIG. 25 illustrates another alternative to the combined drivers of FIG. 23. In this example, the three unitary current circuits 2316a, 2316b, and 2316c of FIG. 23 have been replaced a driver 2504 including a first switchable circuit 2516a providing a unitary current I and a second switchable circuit 2516b providing a 3×I current. In this case, rather than having to turn on both circuits to provide a current flow of 3×I (as in FIG. 24), just the second switchable circuit 2516b can be turned on while the first switchable circuit 2516a can be turned off.

Figure 26:
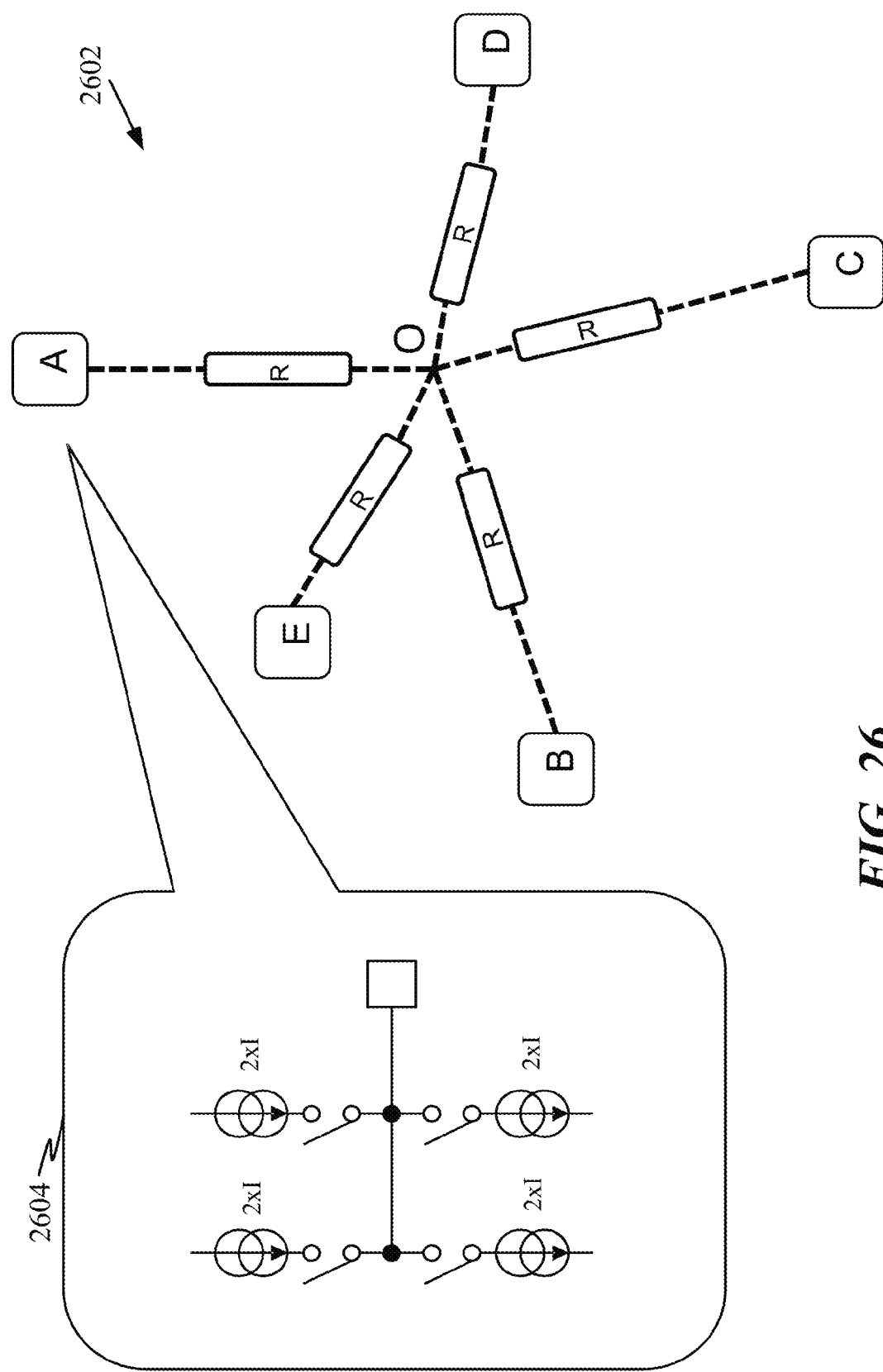
FIG. 26 illustrates the use of combined drivers in a 5-factorial differential signaling termination network.

FIG. 26 illustrates the use of combined drivers 2604 in a 5-factorial differential signaling termination network 2602.

Figure 27:
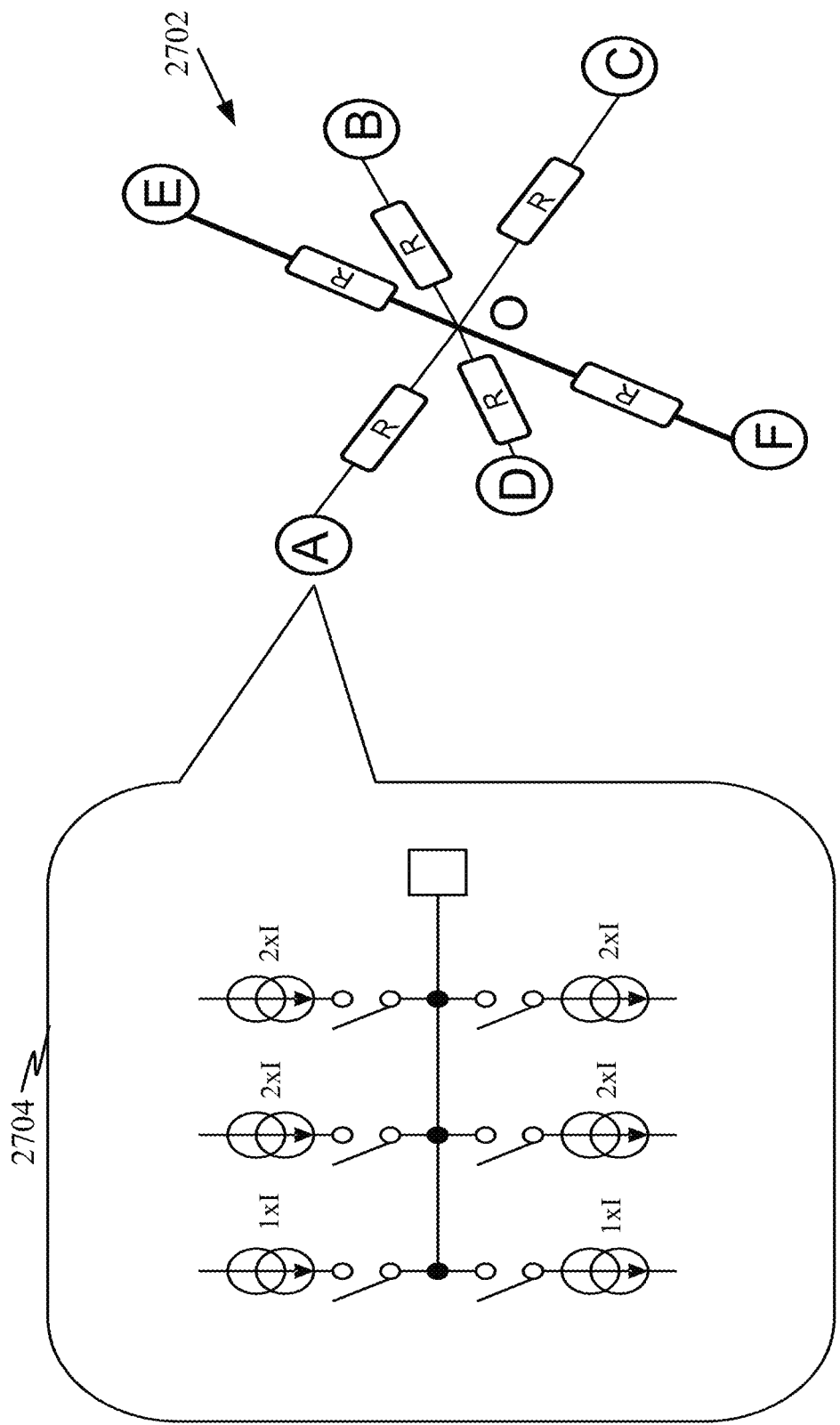
FIG. 27 illustrates the use of combined drivers in a 6-factorial differential signaling termination network.

FIG. 27 illustrates the use of combined drivers 2704 in a 6-factorial differential signaling termination network 2702.

Figure 28:
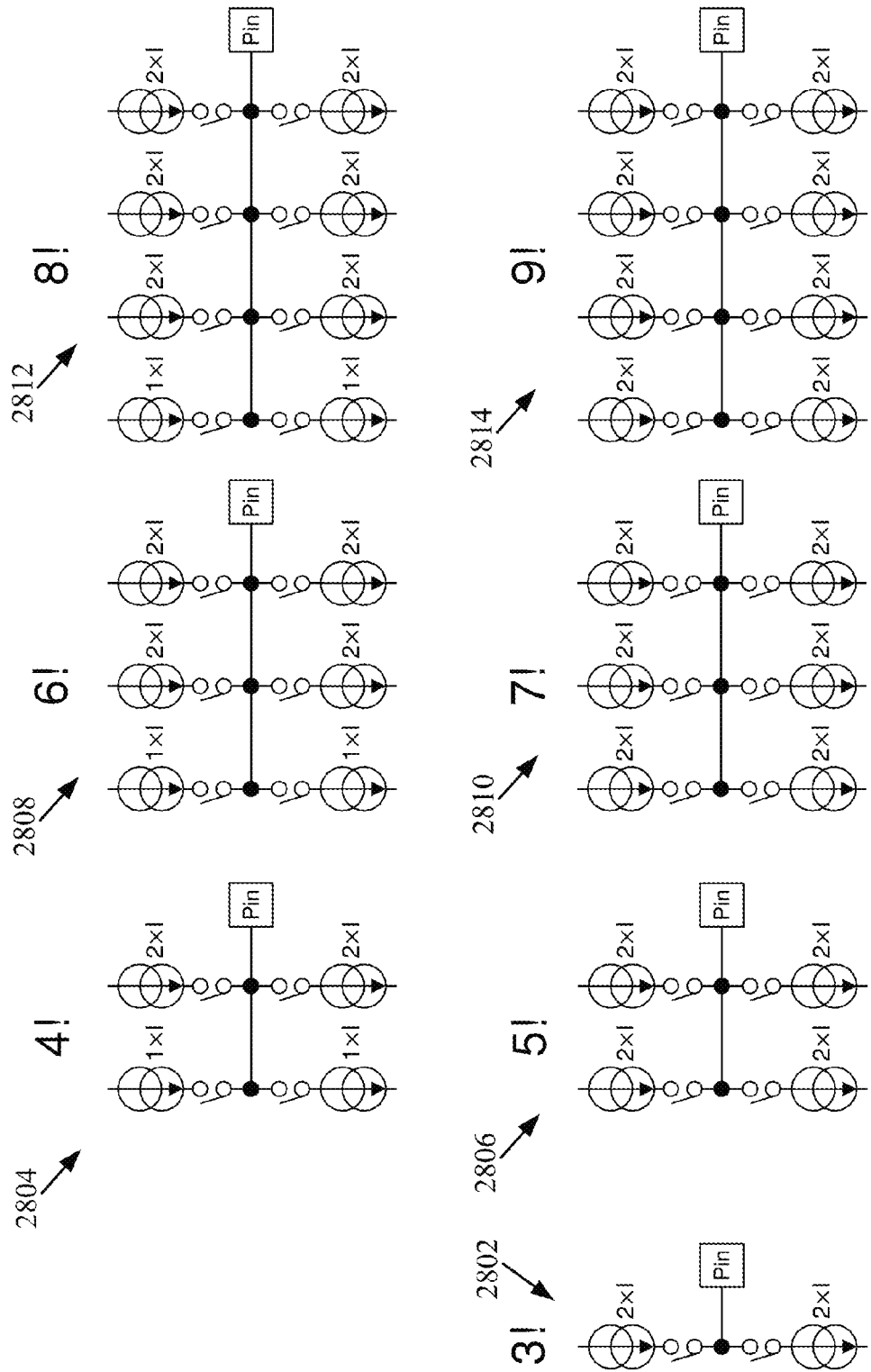
FIG. 28 illustrates various examples of positive/negative termination drivers for various N-factorial termination networks.

FIG. 28 illustrates various examples of positive/negative termination drivers for various N-factorial termination networks. A first driver circuit 2802 may be used, for example, with 3-factorial differential signaling systems. A second driver circuit 2804 may be used, for example, with 4-factorial differential signaling systems. A third driver circuit 2806 may be used, for example, with 5-factorial differential signaling systems. A fourth driver circuit 2808 may be used, for example, with 6-factorial differential signaling systems. A fifth driver circuit 2810 may be used, for example, with 7-factorial differential signaling systems. A sixth driver circuit 2812 may be used, for example, with 8-factorial differential signaling systems. A seventh driver circuit 2814 may be used, for example, with 9-factorial differential signaling systems.

In these exemplary driver circuits, the even n-factorial drivers use a 1×I current flow circuit and one or more 2×I current flow circuits while the odd n-factorial drivers use one or more 2×I current flow circuits.

Figure 29:
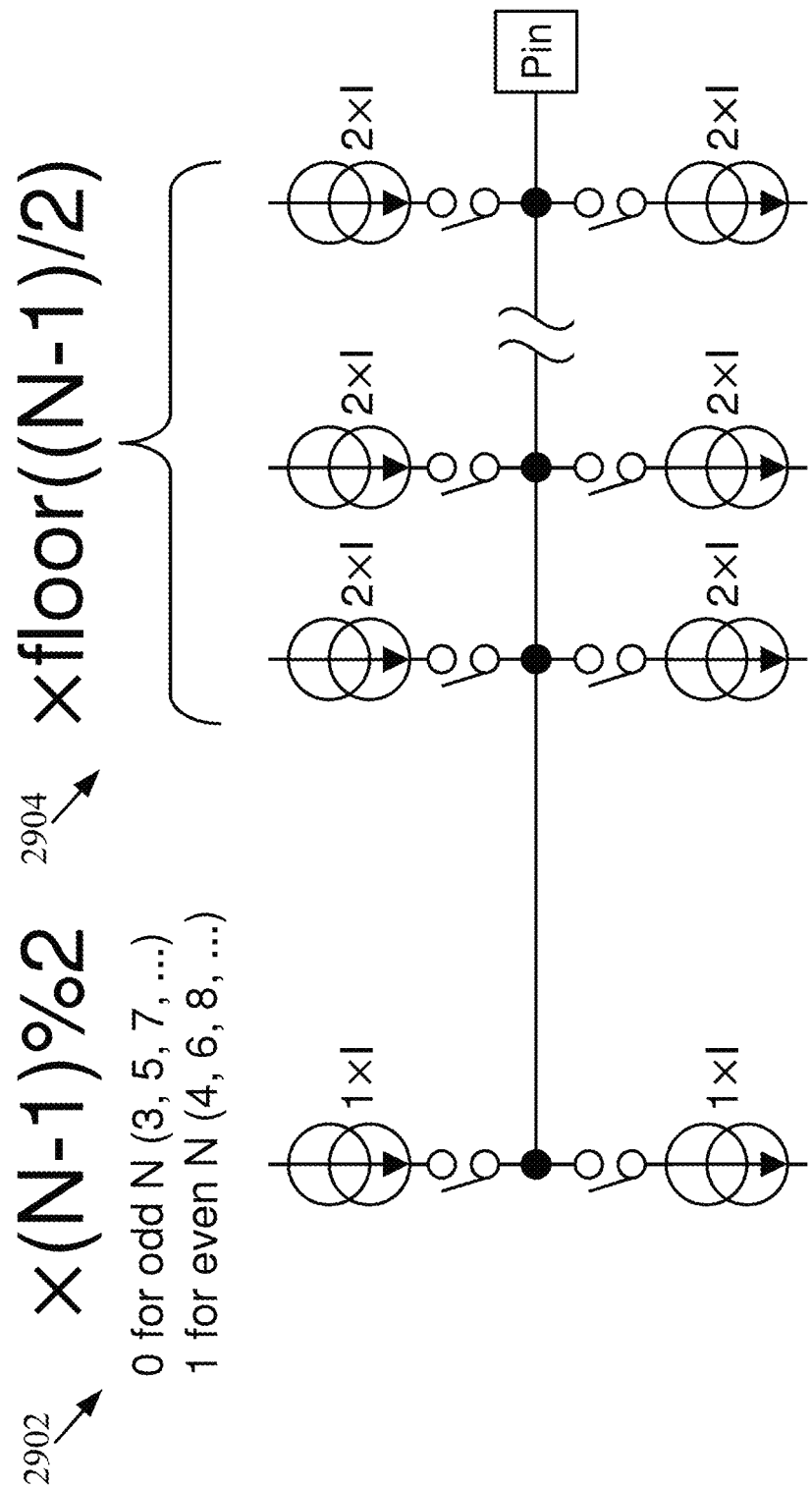
FIG. 29 illustrates the general approach of positive/negative termination drivers for an N-factorial termination network.

FIG. 29 illustrates the general approach of positive/negative termination drivers for an N-factorial termination network. In this exemplary implementation, for any N-factorial differential signaling system, a driver circuit may include a first switchable driver circuit 2902 providing a 1×I current flow and/or one or more second switchable driver circuits 2904 providing a 2×I current flow. Whether or not the first switchable driver circuit 2902 is included in a driver circuit depends on whether N is even or odd. If N is odd (e.g., 3, 5, 7, . . . ) then the first switchable driver circuit 2902 is not included.

Figure 30:
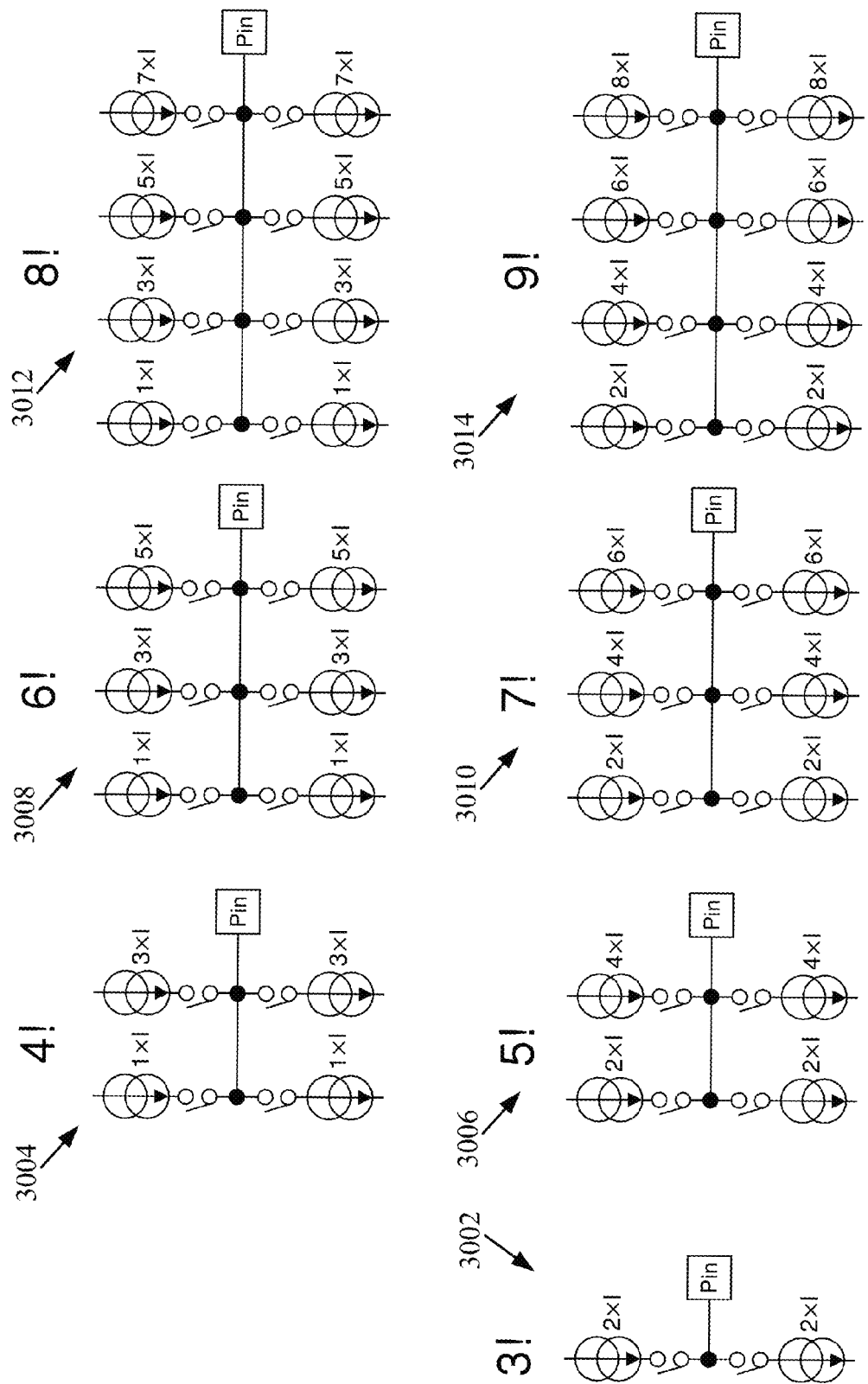
FIG. 30 illustrates various examples of positive/negative termination drivers for various N-factorial termination networks.

FIG. 30 illustrates various examples of positive/negative termination drivers for various N-factorial termination networks. In these examples, each positive/negative termination driver includes multiple switchable circuits of various increasing current values. A first driver circuit 3002 may be used, for example, with 3-factorial differential signaling systems. A second driver circuit 3004 may be used, for example, with 4-factorial differential signaling systems. A third driver circuit 3006 may be used, for example, with 5-factorial differential signaling systems. A fourth driver circuit 3008 may be used, for example, with 6-factorial differential signaling systems. A fifth driver circuit 3010 may be used, for example, with 7-factorial differential signaling systems. A sixth driver circuit 3012 may be used, for example, with 8-factorial differential signaling systems. A seventh driver circuit 3014 may be used, for example, with 9-factorial differential signaling systems. In these exemplary driver circuits, the even n-factorial drivers use a 1×I current flow circuit and one or more current flow circuits of odd-valued incremental current flow magnitudes while the odd n-factorial drivers use one or more 2×I current flow circuits and one or more current flow circuits of even-valued incremental current flow magnitudes.

FIG. 31 illustrates the general approach of positive/negative termination drivers for an N-factorial termination network for even and odd n (e.g., number of wires/conductors used). In this exemplary implementation, for any N-factorial differential signaling system where N is even, a driver circuit 3102 may include a switchable driver circuit providing a 1×I current flow and/or one or more other switchable driver circuits providing current flows that increase by odd-valued incremental current flow magnitudes. For any N-factorial differential signaling system where N is odd, a driver circuit 3104 may include a switchable driver circuit providing a 2×I current flow and/or one or more other switchable driver circuits providing current flows that increase by even-valued incremental current flow magnitudes.

Figure 32:
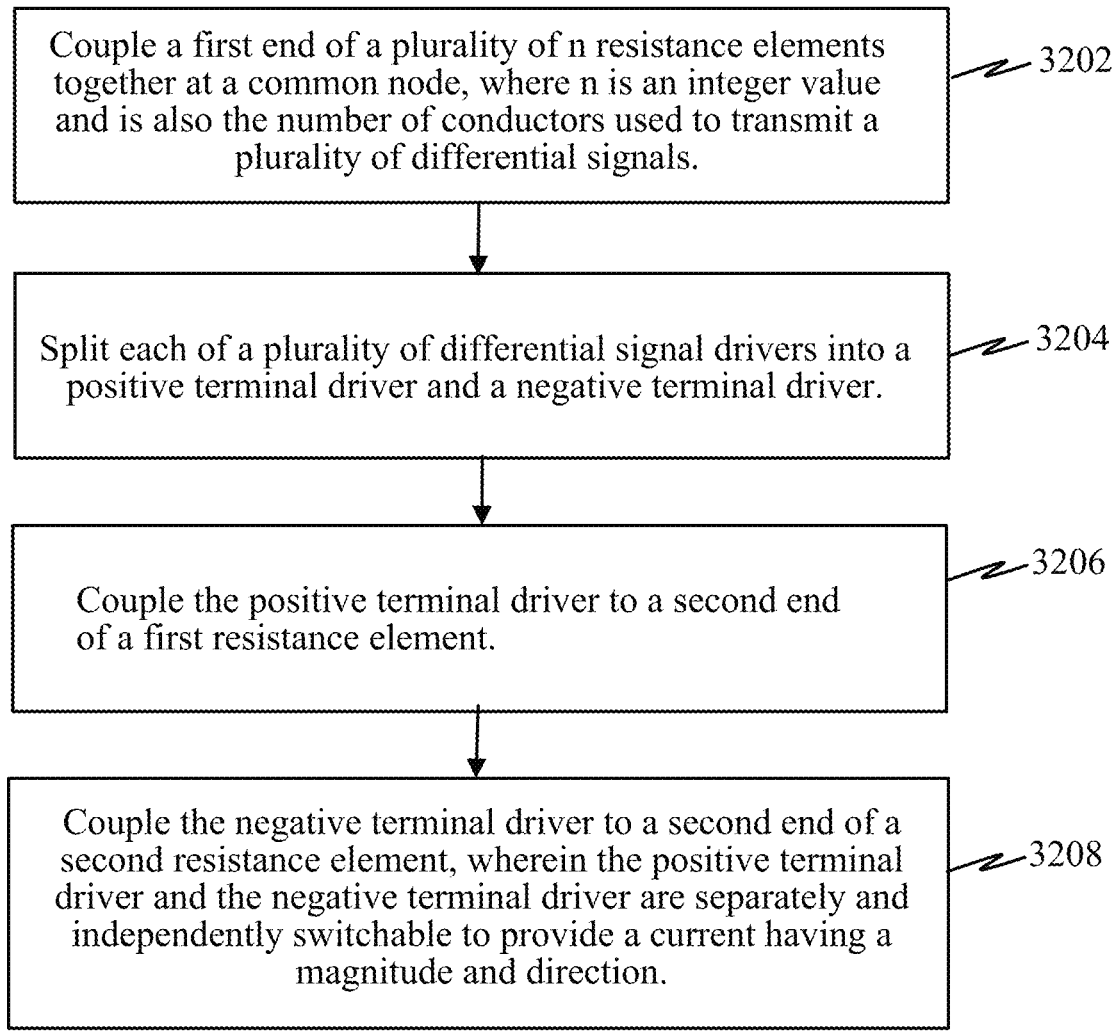
FIG. 32 is a flow diagram illustrating a method for conserving power in a termination network for differential signaling.

FIG. 32 is a flow diagram illustrating a method for conserving power in a termination network for differential signaling. A first end of a plurality of n resistance elements are coupled together at a common node, where n is an integer value and is also the number of conductors used to transmit a plurality of differential signals 3202. Each of a plurality of differential signal drivers may be split into a positive terminal driver and a negative terminal driver 3204. The positive terminal driver may be coupled to a second end of a first resistance element 3206. The negative terminal driver may be coupled to a second end of a second resistance element 3208. The positive terminal driver and the negative terminal driver are separately and independently switchable to provide a current having a magnitude and direction. In one example, all resistance elements have the same resistance value. During a transmission cycle of the plurality differential signals each of the n resistance elements may have a current of a different magnitude and/or direction than the other resistance elements.

One or more of the components, steps, features and/or functions illustrated in the Figures may be rearranged and/or combined into a single component, step, feature or function or embodied in several components, steps, or functions. Additional elements, components, steps, and/or functions may also be added without departing from novel features disclosed herein. The apparatus, devices, and/or components illustrated in the Figures may be configured to perform one or more of the methods, features, or steps described in the Figures. The novel algorithms described herein may also be efficiently implemented in software and/or embedded in hardware.

Also, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a function, a procedure, a subroutine, a subprogram, etc. When a process corresponds to a function, its termination corresponds to a return of the function to the calling function or the main function.

Moreover, a storage medium may represent one or more devices for storing data, including read-only memory (ROM), random access memory (RAM), magnetic disk storage mediums, optical storage mediums, flash memory devices and/or other machine readable mediums for storing information. The term "machine readable medium" includes, but is not limited to, portable or fixed storage devices, optical storage devices, wireless channels and various other mediums capable of storing, containing or carrying instruction(s) and/or data.

Furthermore, embodiments may be implemented by hardware, software, firmware, middleware, microcode, or any combination thereof. When implemented in software, firmware, middleware or microcode, the program code or code segments to perform the necessary tasks may be stored in a machine-readable medium such as a storage medium or other storage(s). A processor may perform the necessary tasks. A code segment may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

The various illustrative logical blocks, modules, circuits, elements, and/or components described in connection with the examples disclosed herein may be implemented or performed with a general purpose processor, a digital signal processor (DSP), an application specific integrated circuit (ASIC), a field programmable gate array (FPGA) or other programmable logic component, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing components, e.g., a combination of a DSP and a microprocessor, a number of microprocessors, one or more microprocessors in conjunction with a DSP core, or any other such configuration.

The methods or algorithms described in connection with the examples disclosed herein may be embodied directly in hardware, in a software module executable by a processor, or in a combination of both, in the form of processing unit, programming instructions, or other directions, and may be contained in a single device or distributed across multiple devices. A software module may reside in RAM memory, flash memory, ROM memory, EPROM memory, EEPROM memory, registers, hard disk, a removable disk, a CD-ROM, or any other form of storage medium known in the art. A storage medium may be coupled to the processor such that the processor can read information from, and write information to, the storage medium. In the alternative, the storage medium may be integral to the processor.

Those of skill in the art would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system.

The various features of the invention described herein can be implemented in different systems without departing from the invention. It should be noted that the foregoing embodiments are merely examples and are not to be construed as limiting the invention. The description of the embodiments is intended to be illustrative, and not to limit the scope of the claims. As such, the present teachings can be readily applied to other types of apparatuses and many alternatives, modifications, and variations will be apparent to those skilled in the art.

What is claimed is:

1. A termination network circuit for a differential signal transmitter, comprising:
a plurality of n resistance elements, wherein a first end of each resistance element in the plurality of n resistance elements is coupled at a common node to the first end of each of the other resistance elements in the plurality of n resistance elements, where n is an integer value and n conductors are used to transmit a plurality of differential signals; and
a plurality of differential signal drivers, each differential signal driver including a positive terminal driver and a negative terminal driver, wherein the positive terminal driver is coupled to a second end of a first resistance element while the negative terminal driver is coupled to a second end of a second resistance element, wherein the positive terminal driver and the negative terminal driver are separately and independently switchable to provide a current having a magnitude and direction.

2. The termination network circuit of claim 1, wherein all resistance elements have a same resistance value.

3. The termination network circuit of claim 1, wherein during a transmission cycle of the plurality of differential signals each of the n resistance elements has a current of a different magnitude and/or direction than the other resistance elements.

4. The termination network circuit of claim 1, wherein a combination of the plurality of differential signals coupled to the n resistance elements during a transmission cycle has a non-zero voltage differential.

5. The termination network circuit of claim 1, wherein n=>3.

6. The termination network circuit of claim 1, wherein the plurality of differential signals is generated from a subset of raw symbols selected from a plurality of possible raw symbols, the subset of raw symbols equaling n! states that generate a non-zero voltage differential at the termination network circuit.

7. The termination network circuit of claim 1, wherein one of the positive terminal driver and negative terminal driver is selectively shut off to eliminate current cancellations across a resistance element.

8. The termination network circuit of claim 1, wherein an electrical path between the plurality of differential signal drivers is only through the plurality of n resistance elements and the common node.

9. The termination network circuit of claim 1, wherein for n=3 conductors, 3 differential signal drivers are used and 2 differential voltage levels to transmit 6 states per cycle.

10. The termination network circuit of claim 1, wherein for n=4 conductors, 6 differential signal drivers are used and 3 differential voltage levels to transmit 24 states per cycle.

11. The termination network circuit of claim 1, wherein for n=5 conductors, 10 differential signal drivers are used and 4 differential voltage levels to transmit 120 states per cycle.

12. The termination network circuit of claim 1, wherein for n=6 conductors, 15 differential signal drivers are used and 5 differential voltage levels to transmit 720 states per cycle.

13. A termination network circuit of claim 1, wherein each positive terminal driver and each negative terminal driver includes a plurality of switchable circuits, each switchable circuit independently controlled from other switchable circuits in the same positive/negative terminal driver.

14. The termination network circuit of claim 13, wherein each switchable circuit includes a first switch that causes current to flow out of a corresponding positive/negative terminal driver, and a second switch that causes current to flow into the corresponding positive/negative terminal driver.

15. The termination network circuit of claim 13, wherein the plurality of switchable circuits includes a first switchable circuit that provides a first current flow to/from a corresponding terminal and a second switchable circuit that provides a second current flow to/from the corresponding terminal.

16. The termination network circuit of claim 15, wherein the second current flow is of different magnitude but same direction as the first current flow.

17. The termination network circuit of claim 15, wherein the second current flow is an integer multiple of the first current flow.

18. The termination network circuit of claim 15, wherein the plurality of switchable circuits further includes a third switchable circuit that provides a third current flow to/from the corresponding terminal, where the second current flow is a fixed increment from the first current flow, and the third current flow is the same fixed increment from the second current flow.

19. The termination network circuit of claim 15, wherein the magnitude and/or number of switchable circuits is a function of the number of conductors used.

20. A method for conserving power in a termination network for differential signaling, comprising:
coupling a first end of each resistance element in a plurality of n resistance elements to the first end of each of the other resistance elements in the plurality of n resistance elements at a common node, where n is an integer value and n conductors are used to transmit a plurality of differential signals;

splitting each of a plurality of differential signal drivers into a positive terminal driver and a negative terminal driver;

coupling the positive terminal driver to a second end of a first resistance element; and coupling the negative terminal driver to a second end of a second resistance element, wherein the positive terminal driver and the negative terminal driver are separately and independently switchable to provide a current having a magnitude and direction.

21. The method of claim 20, wherein all resistance elements have a same resistance value.

22. The method of claim 20, wherein during a transmission cycle of the plurality of differential signals each of the n resistance elements has a current of a different magnitude and/or direction than the other resistance elements.

23. The method of claim 20, wherein a combination of all of the plurality of differential signals coupled to the n resistance elements during a transmission cycle has a non-zero voltage differential.

24. The method of claim 20, wherein n=>3.

25. The method of claim 20, wherein the plurality of differential signals is generated from a subset of raw symbols selected from a plurality of possible raw symbols, the subset of raw symbols equaling n! states that generate a non-zero voltage differential at the termination network.

26. The method of claim 20, wherein one of the positive terminal driver and the negative terminal driver is selectively shut off to eliminate current cancellations across a resistance element.

27. The method of claim 20, wherein an electrical path between the plurality of differential signal drivers is only through the plurality of n resistance elements and the common node.

28. The method of claim 20, wherein for n=3 conductors, 3 differential signal drivers are used and 2 differential voltage levels to transmit 6 states per cycle.

29. The method of claim 20, wherein for n=4 conductors, 6 differential signal drivers are used and 3 differential voltage levels to transmit 24 states per cycle.

30. The method of claim 20, wherein for n=5 conductors, 10 differential signal drivers are used and 4 differential voltage levels to transmit 120 states per cycle.

31. The method of claim 20, wherein for n=6 conductors, 15 differential signal drivers are used and 5 differential voltage levels to transmit 720 states per cycle.

32. The method of claim 20, wherein each positive terminal driver and each negative terminal driver includes a plurality of switchable circuits, each switchable circuit independently controlled from other switchable circuit in the same positive/negative terminal driver.

33. The method of claim 32, wherein each switchable circuit includes a first switch that causes current to flow out of a corresponding positive/negative terminal driver, and a second switch that causes current to flow into the corresponding positive/negative terminal driver.

34. The method of claim 32, wherein the plurality of switchable circuits includes a first switchable circuit that provides a first current flow to/from a corresponding terminal and a second switchable circuit that provides a second current flow to/from the corresponding terminal.

35. The method of claim 34, wherein the second current flow is of different magnitude but same direction as the first current flow.

36. The method of claim 34, wherein the plurality of switchable circuits further includes a third switchable circuit that provides a third current flow to/from the corresponding terminal, where the second current flow is a fixed increment from the first current flow, and the third current flow is the same fixed increment from the second current flow.

* * * * *